United States Patent
Segoria

(10) Patent No.: US 10,476,157 B1
(45) Date of Patent: Nov. 12, 2019

(54) TURNABLE PASSIVE PHASE SHIFTER

(71) Applicant: Qualcomm Incorporated, San Diego, CA (US)

(72) Inventor: Anthony Segoria, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 16/142,858

(22) Filed: Sep. 26, 2018

(51) Int. Cl.
*H01Q 3/36* (2006.01)
*H03H 7/20* (2006.01)

(52) U.S. Cl.
CPC ............. *H01Q 3/36* (2013.01); *H03H 7/20* (2013.01)

(58) Field of Classification Search
CPC .................................. H01Q 3/36; H03H 7/20
USPC ............................................................ 455/77
See application file for complete search history.

(56) References Cited

U.S. PATENT DOCUMENTS

| | | | |
|---|---|---|---|
| 4,963,773 A | 10/1990 | Ayasli et al. | |
| 7,683,737 B2 | 3/2010 | Lapin et al. | |
| 8,610,477 B2 | 12/2013 | Koechlin et al. | |
| 9,787,286 B2 | 10/2017 | Sharma | |
| 2003/0020563 A1 | 1/2003 | Hieda et al. | |
| 2010/0117758 A1* | 5/2010 | Miya .................. | H03H 7/20 333/139 |
| 2016/0380623 A1* | 12/2016 | Allison ................ | H03K 5/08 327/237 |
| 2018/0234080 A1* | 8/2018 | Shrivastava .......... | H03H 11/20 |
| 2019/0172635 A1 | 6/2019 | Ku et al. | |

FOREIGN PATENT DOCUMENTS

| | | |
|---|---|---|
| CN | 105280991 A | 1/2016 |
| WO | 2017080263 A1 | 5/2017 |

OTHER PUBLICATIONS

Kang, Dong-Woo, Ku-band MMIC phase shifter using a parallel resonator with 0.18 um CMOS technology, IEEE T-MTT, vol. 54, No. 1, pp. 294-301, Oct. 2006.
Campbell C.F., et al., "A Compact 5-Bit Phase-Shifter MMIC for K-Band Satellite Communication Systems", IEEE Transactions on Microwave Theory and Techniques, Plenum, USA, vol. 48, No. 12, Dec. 1, 2000 (Dec. 1, 2000), XP011038148, ISSN: 0018-9480.

(Continued)

*Primary Examiner* — Ayodeji O Ayotunde
(74) *Attorney, Agent, or Firm* — Colby Nipper/Qualcomm

(57) ABSTRACT

An apparatus is disclosed including a tunable passive phase shifter. In example implementations, a phase shifter reuses one or more inductors for multiple bands and can reduce switch use along a propagation path to lower insertion loss. In an example aspect, an apparatus for phase shifting includes a phase shifter having a first port and a second port. The phase shifter includes an inductive path, which is coupled between the first and second ports, and first and second bypass paths. The inductive path includes multiple inductors and multiple nodes. The multiple inductors are coupled together in series between the first and second ports. The multiple nodes are interleaved with the multiple inductors along the inductive path. The first bypass path is coupled to a first pair of nodes of the multiple nodes, and the second bypass path is coupled to a second pair of nodes of the multiple nodes.

30 Claims, 11 Drawing Sheets

(56) References Cited

OTHER PUBLICATIONS

Juseok B., et al., "A Small-Insertion-Loss-Variation Phase Shifter with Optimized Body-Floating Transistors", 2015 10th European Microwave Integrated Circuits Conference (EUMIC), EUMA, Sep. 7, 2015 (Sep. 7, 2015), XP032823251, pp. 128-131, DOI: 10.1109/EUMIC.2015.7345085 [retrieved on Dec. 2, 2015].

Kim K-J., et al., "Design of 60 GHz Vector Modulator Based Active Phase Shifter," 2011 Sixth IEEE International Symposium on Electronic Design, Test and Application, IEEE, 2011, pp. 140-143.

Kim K-J., et al., "Design of 60 GHz Vector Modulator Based Active Phase Shifter," Microelectronics and Solid State Electronics, 2012, vol. 1(4), pp. 81-84.

Koh K-J., et al., "0.13-μm CMOS Phase Shifters for X-, Ku-, and K-Band Phased Arrays", IEEE Journal of Solid-State Circuits, vol. 42, No. 11, Nov. 2007, pp. 2535-2546.

Krishnaswamy H., et al., "A Silicon-based, all-Passive, 60 GHz, 4-element, Phased-Array Beamformer featuring a Differential, Reflection-Type Phase Shifter", 2010 IEEE International Symposium on Phased Array Systems and Technology, IEEE, 2010, pp. 225-232.

Min B-W., et al., "Single-Ended and Differential Ka-Band BiCMOS Phased Array Front-Ends" IEEE J. of Solid-State Circuits, Oct. 2008, vol. 43, No. 10, pp. 2239-2250.

Nagra A.S., et al., "Distributed Analog Phase Shifters with Low Insertion Loss", IEEE Transactions on Microwave Theory and Techniques, Sep. 1999, vol. 47, No. 9, pp. 1705-1711.

Natarajan A., et al., "A Fully-Integrated 16-Element Phased-Array Receiver in SiGe BiCMOS for 60-GHz Communications," IEEE Journal of Solid-State Circuits, May 2011, vol. 46 (5), pp. 1059-1075.

Parlak M., et al., "A Low-Power, W-Band Phase Shifter in a 0.12μm SiGe BiCMOS Process", IEEE Microwave and Wireless Components Letters, Nov. 2010, vol. 20, No. 11, pp. 631-633.

Pepe D., et al., "Two mm-Wave Vector Modulator Active Phase Shifters With Novel IQ Generator in 28 nm FDSOI CMOS", IEEE Journal of Solid-State Circuits, Feb. 2017, vol. 52, No. 2, pp. 344-356.

Shin G.S., et al., "Low Insertion Loss, Compact 4-bit Phase Shifter in 65 nm CMOS for 5G Applications", IEEE Microwave and Wireless Components Letters, Jan. 2016, vol. 26, No. 1, pp. 37-39.

Tousi Y., et al., "A Ka-band Digitally-Controlled Phase Shifter with Sub-degree Phase Precision", 2016 IEEE Radio Frequency Integrated Circuits Symposium (RFIC), IEEE, 2016, pp. 356-359.

Tsai M.D., et al., "60GHz Passive and Active RF-Path Phase Shifters in Silicon", 2009 IEEE Radio Frequency Integrated Circuits Symposium, IEEE, 2009, pp. 223-226.

Valdes-Garcia, et al., "A Fully Integrated 16-Element Phased-Array Transmitter in SiGe BiCMOS for 60-GHz Communications," IEEE Journal of Solid-State Circuits, vol. 45, No. 12, Dec. 2010, pp. 2757-2773.

Wu J.C., et al., "A 24-GHz full-360° CMOS Reflection-Type Phase Shifter MMIC with Low Loss-Variation", 2008 IEEE Radio Frequency Integrated Circuits Symposium, IEEE, 2008, pp. 365-368.

Yu et al., "A 60 GHz Phase Shifter Integrated with LNA and PA in 65 nm CMOS for Phased Array Systems," IEEE Journal of Solid-State Circuits, vol. 45 No. 9, Sep. 2010, pp. 1697-1709.

Yu Y., et. al, "A 60GHz Digitally Controlled Phase Shifter in CMOS" 34th European Solid-State Circuits Conference, 2008, ESSCIRC 2008, pp. 250-253.

\* cited by examiner

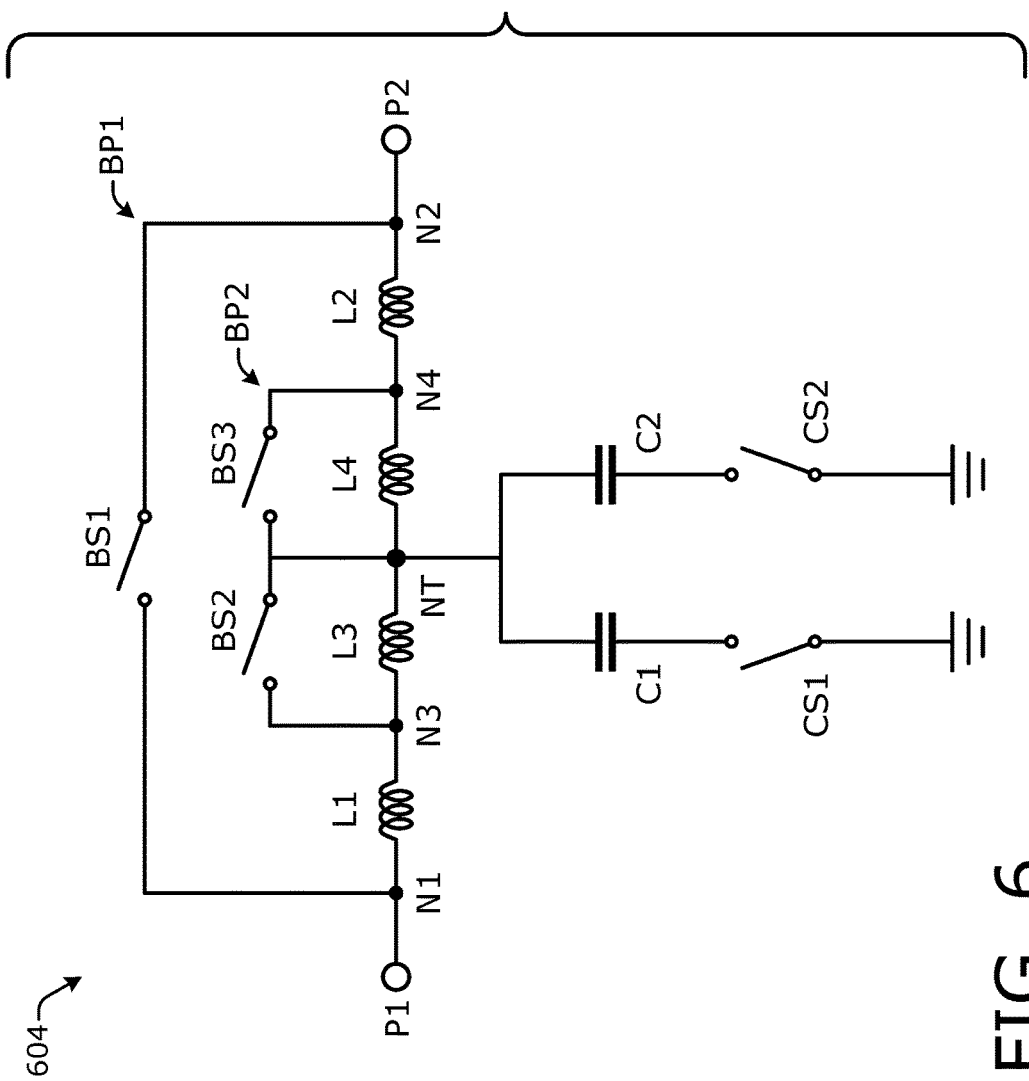
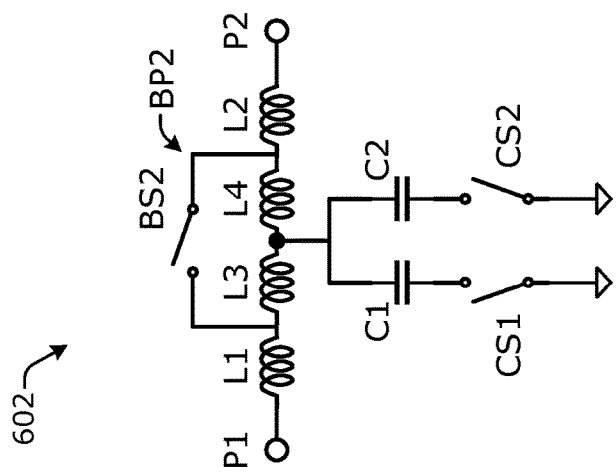
FIG. 6

TURNABLE PASSIVE PHASE SHIFTER

TECHNICAL FIELD

This disclosure relates generally to wireless communications with electronic devices and, more specifically, to implementing a tunable passive phase shifter as part of a radio-frequency front-end (RFFE).

BACKGROUND

Electronic devices include traditional computing devices such as desktop computers, notebook computers, smartphones, wearable devices like a smartwatch, internet servers, and so forth. However, electronic devices also include other types of computing devices such as personal voice assistants, thermostats, automotive electronics, robotics, devices embedded in other machines like refrigerators and industrial tools, Internet of Things (IoT) devices, and so forth. These various electronic devices provide services relating to productivity, remote communication, social interaction, security, safety, entertainment, transportation, and information dissemination. Thus, electronic devices play crucial roles in many aspects of modern society.

Many of the services provided by electronic devices in today's interconnected world depend at least partly on electronic communications. Electronic communications include, for example, those exchanged between or among different electronic devices using wireless or wired signals that are transmitted over one or more networks, such as the Internet or a cellular network. Electronic communications therefore include both wireless and wired transmissions and receptions. To make such electronic communications, an electronic device uses a transceiver, such as a wireless transceiver.

Electronic communications can therefore be realized by propagating signals between two wireless transceivers at two different electronic devices. For example, using a wireless transmitter, a smart phone can transmit a wireless signal to a base station over an air medium as part of an uplink communication to support mobile services. Using a wireless receiver, the smart phone can receive a wireless signal from the base station via the air medium as part of a downlink communication to enable mobile services. With a smart phone, mobile services can include phone and video calls, social media interactions, messaging, watching movies, sharing videos, performing searches, acquiring map information or navigational instructions, locating friends, transferring money, obtaining another service like a car ride, and so forth.

To provide these types of services, electronic devices typically use a wireless transceiver to communicate wireless signals in accordance with some wireless standard. Examples of wireless standards include an IEEE 802.11 Wi-Fi standard and a Fourth Generation (4G) cellular standard, both of which we use today with smartphones and other connected devices. However, efforts to enable a Fifth Generation (5G) wireless standard are ongoing. Next-generation 5G wireless networks are expected to offer significantly higher bandwidths, lower latencies, and access to additional electromagnetic spectrum. Taken together, this means that exciting new wireless services can be provided to users, such as driverless vehicles, augmented reality (AR) and other mixed reality (MR) imaging, on-the-go 4K video streaming, ubiquitous sensors to keep people safe and to use natural resources more efficiently, real-time language translations, and so forth.

To make these new 5G technologies more widely available, many wireless devices in addition to smart phones will be deployed, which is sometimes called the "Internet of Things" (IoT). Compared to today's use of wireless devices, tens of billions, and eventually trillions, of more devices are expected to be connected to the internet with the arrival of the Internet of Things. These IoT devices may include small, inexpensive, and low-powered devices, like sensors and tracking tags. Further, to enable next-generation wireless technologies, 5G wireless devices will be communicating with signals that use wider frequency ranges and that span bands located at higher frequencies of the electromagnetic spectrum as compared to those of previous wireless standards. As described above, many of these wireless devices—including smart phones and IoT devices—will be expected to be small, to be inexpensive, to consume less power, or some combination thereof.

Thus, the components that enable wireless communications under these constraints will likewise be expected to be tiny, low cost, and capable of functioning with less energy use. One component that facilitates electronic communication is the wireless interface, which can include a wireless transceiver and a radio-frequency front-end (RFFE). Unfortunately, the wireless interfaces designed for devices that operate in accordance with the 4G cellular standard of today are not adequate for the 5G-capable devices of tomorrow, which devices will confront higher frequencies, more-stringent technical demands, and tighter fiscal constraints.

Consequently, to facilitate the adoption of 5G technologies and the widespread deployment of wireless devices that can provide new capabilities and services, existing wireless interfaces will be replaced with those having superior designs that occupy less space or consume less power while still handling the higher frequencies of 5G networks. Electrical engineers and other designers of electronic devices are therefore striving to develop new wireless interfaces that will enable the promise of 5G technologies to become a reality.

SUMMARY

The developing 5G wireless standards are intended to establish broadband capabilities at higher frequencies in the gigahertz (GHz) range, including those with corresponding millimeter-sized wavelengths (e.g., mmW frequencies). To enable wireless communications with mmW frequencies, electronic devices will use signal beamforming. Beamforming entails employing an antenna array and multiple phase shifters to direct a signal beam. Employing active phase shifters to generate signal beams would consume power. Although passive phase shifters do not consume power, existing passive phase shifters use fixed inductors and capacitors for each frequency band. Consequently, to handle broadband communications with existing approaches, multiple passive phase shifters would be employed to respectively cover multiple frequency bands at each antenna element of an antenna array. Using multiple passive phase shifters, especially per antenna element, would occupy the limited space in a wireless interface and increases costs. Further, in the case of narrowband antenna designs, more than one phase shifter would be required in a bill of material (BOM) for the associated narrowband system if multiple narrow frequency bands are to be covered.

To address these issues, example implementations described herein include a passive phase shifter that can handle multiple frequency bands by reusing at least one inductor of multiple inductors for different frequency bands.

This approach reduces a size and cost for deploying passive phase shifters for each antenna element of an antenna array. Furthermore, examples of a tunable passive phase shifter are described that can switch from one band to another band using few or no switches that are disposed along an inductive path that provides a route for signal propagation. The reduction of switches along the propagation route reduces insertion loss. To realize such implementations, multiple inductors are coupled together in series between a first port (e.g., an input port) and a second port (e.g., an output port) of a multi-band tunable passive phase shifter. At least one bypass path is coupled along the series-coupled inductors to provide different levels of inductance for different frequency bands. Signals corresponding to a first frequency band can utilize, for example, all the inductors along the series-coupled inductors. Signals corresponding to a second frequency band use fewer than all of the inductors—e.g., a subset of the series-coupled inductors—by "detouring" the signal around at least one inductor. Further, two or more capacitors tuned for the first and second frequency bands can be coupled to a central tap node along the series-coupled inductors to provide impedance matching.

In an example aspect, an apparatus for phase shifting is disclosed. The apparatus includes a phase shifter having a first port and a second port. The phase shifter includes an inductive path, a first bypass path, and a second bypass path. The inductive path is coupled between the first port and the second port. The inductive path includes multiple inductors and multiple nodes. The multiple inductors are coupled together in series between the first port and the second port. The multiple nodes are interleaved with the multiple inductors along the inductive path. The first bypass path is coupled to a first pair of nodes of the multiple nodes, and the second bypass path is coupled to a second pair of nodes of the multiple nodes.

In an example aspect, a system for shifting phases of signals is disclosed. The system includes a multi-band phase shifter having a first port and a second port. The system also includes an inductive path coupled between the first port and the second port. The inductive path includes multiple nodes comprising a first pair of nodes and a second pair of nodes. The inductive path also includes multiple inductors coupled together in series and interleaved with the multiple nodes. Each node of the second pair of nodes is positioned between two inductors of the multiple inductors. The system further includes bypass means for switching a frequency band to which the multi-band phase shifter is tuned, with the bypass means coupled to the second pair of nodes and configured to selectively enable a signal detour around a portion of the multiple inductors.

In an example aspect, a method for operating a tunable passive phase shifter is disclosed. The method includes, responsive to a band indication signal corresponding to a first frequency band, propagating a signal through at least four inductors coupled together in series between a first port and a second port of the tunable passive phase shifter. The method also includes, responsive to the band indication signal corresponding to a second frequency band, closing a bypass switch to bypass at least two inductors of the at least four inductors and propagating a signal between the first port and the second port. The propagation of the signal between the first port and the second port includes detouring the signal around the at least two inductors and routing the signal through multiple remaining inductors of the at least four inductors.

In an example aspect, an apparatus for phase shifting is disclosed. The apparatus includes a phase shifter having multiple ports and multiple nodes. The multiple ports include a first port and a second port. The multiple nodes include a first node, a second node, a third node, a fourth node, and a tap node. The first node is coupled to the first port, and the second node is coupled to the second port. The phase shifter also has multiple inductors including a first inductor, a second inductor, a third inductor, and a fourth inductor. The first inductor is coupled between the first node and the third node, and the third inductor is coupled between the third node and the tap node. The fourth inductor is coupled between the tap node and the fourth node, and the second inductor is coupled between the fourth node and the second node. The phase shifter further includes a bypass path coupled to the third node and the fourth node, with the bypass path including a bypass switch.

BRIEF DESCRIPTION OF DRAWINGS

FIG. 4-1 is a circuit diagram illustrating an example tunable passive phase shifter with multiple inductors and at least one bypass path.

FIG. 4-2 is another circuit diagram illustrating an example tunable passive phase shifter in conjunction with an RFFE controller.

FIG. 6 depicts two circuit diagrams illustrating two alternative implementations of an example tunable passive phase shifter.

FIG. 8-1 illustrates an example physical implementation for multiple inductors of a tunable passive phase shifter.

FIG. 8-2 illustrates another example physical implementation for multiple inductors of a tunable passive phase shifter in conjunction with multiple tuning extensions.

DETAILED DESCRIPTION

Figure 1:
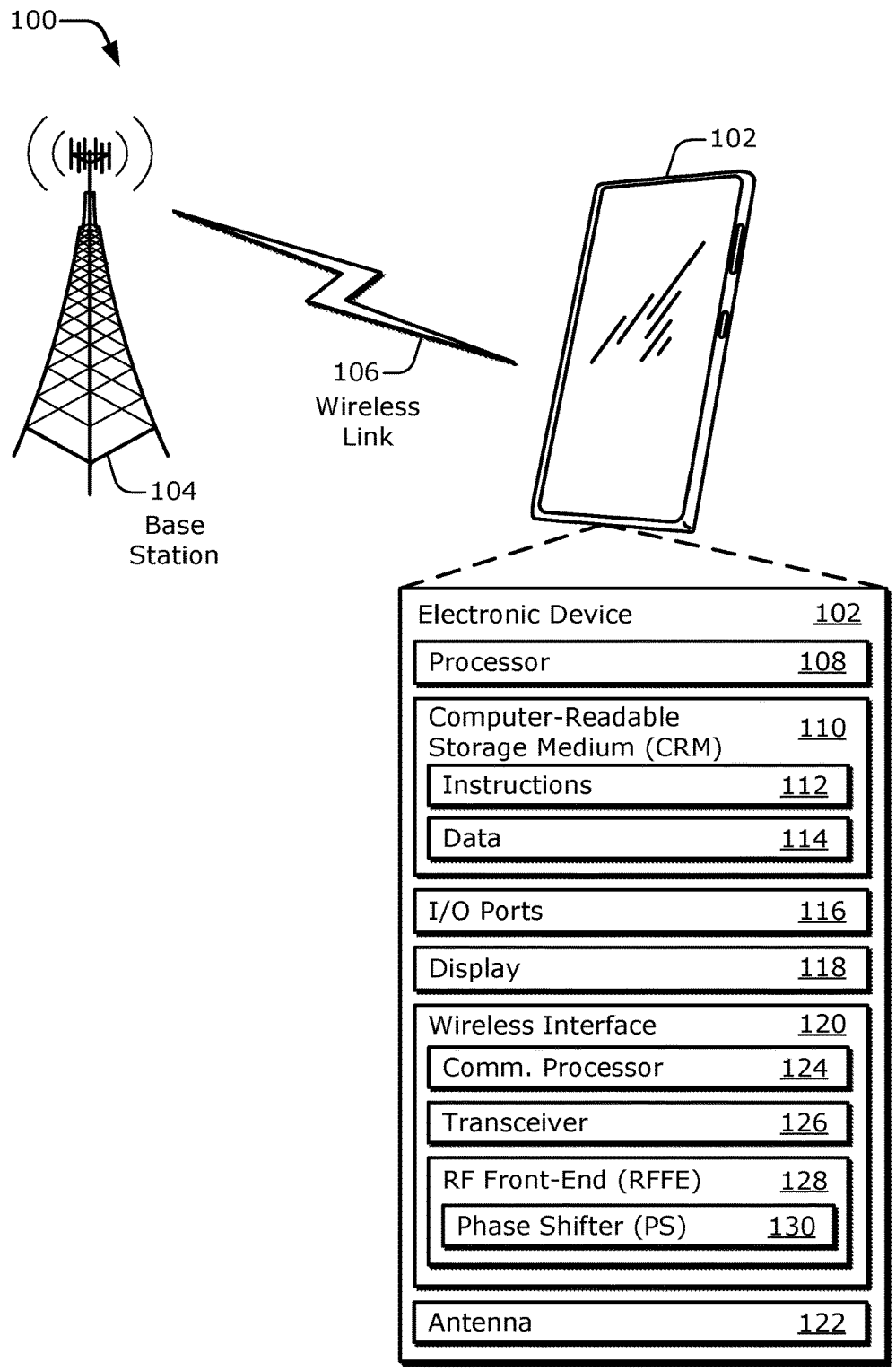
FIG. 1 illustrates an example environment that includes an electronic device having a radio-frequency front-end (RFFE) in which a tunable passive phase shifter can be implemented.

As compared to 4G networks, next-generation 5G networks will utilize higher electromagnetic (EM) frequencies, such as millimeter wave (mmW) frequencies that can span approximately 3 to 300 Gigahertz (GHz) of the EM spectrum. Although higher frequencies can offer higher bandwidth and lower latency, higher frequencies also create problems. For example, signals transmitted at higher frequencies are attenuated by the atmosphere more quickly and therefore have shorter intrinsic ranges at a given power level. To account for the naturally-shorter transmission distances, signals can be transmitted in signal beams that direct a signal toward a particular target with more effective power, which is called antenna beamforming. Using beamforming, a transmission at a given power level can travel farther in a signal beam as compared to being transmitted omnidirectionally.

Thus, 5G electronic devices may utilize beamforming to direct signals toward receiving devices. The wireless interface of an electronic device is at least partially responsible for generating signal beams. To form a signal beam, a wireless interface emanates multiple versions of a transmission signal in which the versions are delayed in time, or phase shifted, with respect to each other. A phase shifter is therefore employed as part of a beamforming operation. Moreover, because a different phase shifter is used for each antenna element of an antenna array to shift a phase of each signal version, many phase shifters are employed within a single wireless interface of a wireless device—especially if the wireless device includes multiple antenna arrays.

Accordingly, any impact by a single phase shifter on an electronic device, such as by its size or power consumption, is multiplied by the number of phase shifters. Active phase shifters consume power and can be relatively large. Passive phase shifters, on the other hand, use one or more inductors to shift a phase of a signal without active power consumption. Although passive phase shifters do not actively consume power, existing passive phase shifters are designed to handle a relatively narrow frequency band. Consequently, employing existing passive phase shifters would involve using multiple narrowband phase shifters for each antenna element, with each narrowband phase shifter having one or more inductors. Especially because inductors occupy a relatively large area of an integrated circuit, existing passive narrowband phase shifters are inefficient for broadband deployment due to their large sizes and associated costs.

In contrast, tunable passive phase shifters are described herein that can be efficiently deployed in broadband environments. A tunable passive phase shifter can be deployed per antenna element to handle at least two frequency bands across a broadband frequency range. In example implementations, inductors are associated with first and second frequency bands. However, at least one inductor for the second frequency band is reused for the first frequency band to save area on an integrated circuit. Further, a quantity of switches, which are present along a main propagation path for a signal being phase shifted, can be reduced. Reducing the switch count faced by a propagating signal improves insertion loss, so less signal strength is sapped by the phase shifting operation.

To realize such implementations, multiple inductors are coupled together in series between a first port (e.g., an input port) and a second port (e.g., an output port) of a multi-band tunable passive phase shifter. At least one switchable bypass path is coupled along the series-coupled inductors to provide different levels of inductance for different frequency bands. Signals corresponding to a first frequency band can utilize, for example, all the inductors along the series-coupled inductors. Signals corresponding to a second frequency band use fewer than all the inductors—e.g., a subset of the series-coupled inductors—by detouring around at least one inductor using the switchable bypass path. Further, two or more capacitors tuned for the first and second frequency bands can be coupled to a tap node along the series-coupled inductors for impedance matching.

In other implementations, another switchable bypass path can enable a signal to bypass all of the inductors to disengage the tunable passive phase shifter. This other switchable bypass path can be included, for instance, to enable the tunable passive phase shifter to be employed as part of a multi-bit multi-band phase shifter that can provide different phase shift amounts (e.g., a three-bit phase shifter). In these manners, a tunable passive phase shifter provides a smaller footprint by reusing inductors and sustains signal strength of a phase-shifted signal by managing insertion loss.

FIG. 1 illustrates an example environment 100 that includes an electronic device 102 having a radio-frequency front-end 128 (RF front-end 128 or RFFE 128) in which a tunable passive phase shifter can be implemented. In the environment 100, the example electronic device 102 communicates with a base station 104 through a wireless link 106. As shown, the electronic device 102 is depicted as a smart phone. However, the electronic device 102 may be implemented as any suitable computing or other electronic device, such as a cellular base station, broadband router, access point, cellular or mobile phone, gaming device, navigation device, media device, laptop computer, desktop computer, tablet computer, server computer, network-attached storage (NAS) device, smart appliance, vehicle-based communication system, Internet of Things (IoT) device, sensor or security device, asset tracker, fitness management device, wearable device such as intelligent glasses or smart watch, wireless power device (transmitter or receiver), and so forth.

The base station 104 communicates with the electronic device 102 via the wireless link 106, which may be implemented as any suitable type of wireless link. Although depicted as a base station tower of a cellular radio network, the base station 104 may represent or be implemented as another device, such as a satellite, terrestrial broadcast tower, access point, peer-to-peer device, mesh network node, fiber optic line, another electronic device generally as described above, and so forth. Hence, the electronic device 102 may communicate with the base station 104 or another device via a wired connection, a wireless connection, or a combination thereof.

The wireless link 106 extends between the electronic device 102 and the base station 104. The wireless link 106 can include a downlink of data or control information communicated from the base station 104 to the electronic device 102 and an uplink of other data or control information communicated from the electronic device 102 to the base station 104. The wireless link 106 may be implemented using any suitable communication protocol or standard, such as 3rd Generation Partnership Project Long-Term Evolution (3GPP LTE), IEEE 802.11, IEEE 802.16, Bluetooth™, and so forth.

As shown, the electronic device 102 includes a processor 108 and a computer-readable storage medium 110 (CRM 110). The processor 108 may include any type of processor, such as an application processor or a multi-core processor, that is configured to execute processor-executable instructions (e.g., code) stored by the CRM 110. The CRM 110 may include any suitable type of data storage media, such as volatile memory (e.g., random access memory (RAM)), non-volatile memory (e.g., Flash memory), optical media, magnetic media (e.g., disk or tape), and so forth. In the context of this disclosure, the CRM 110 is implemented to store instructions 112, data 114, and other information of the electronic device 102, and thus the CRM 110 does not include transitory propagating signals or carrier waves.

The electronic device 102 may also include input/output ports 116 (I/O ports 116) or a display 118. The I/O ports 116 enable data exchanges or interaction with other devices, networks, or users. The I/O ports 116 may include serial ports (e.g., universal serial bus (USB) ports), parallel ports, audio ports, infrared (IR) ports, camera or other sensor ports, and so forth. The display 118 can be realized as a screen or projection that presents graphics provided by the electronic device 102, such as a user interface associated with an operating system, program, or application. Alternatively or additionally, the display 118 may be implemented as a display port or virtual interface through which graphical content of the electronic device 102 is communicated or presented.

The electronic device 102 also includes at least one wireless interface 120 and at least one antenna 122. The wireless interface 120 provides connectivity to respective networks and peer devices via a wireless link, which may be configured similar to or differently from the wireless link 106. Alternatively or additionally, the electronic device 102 may include a wired interface, such as an Ethernet or fiber optic transceiver for communicating over a wired local network, an intranet, or the Internet. The wireless interface 120 may facilitate communication over any suitable type of wireless network, such as a wireless LAN (WLAN), peer-to-peer (P2P) network, mesh network, cellular network, wireless wide-area-network (WWAN), a navigational network (e.g., the Global Positioning System (GPS) of North America or another Global Navigation Satellite System (GNSS)), and/or wireless personal-area-network (WPAN). In the context of the example environment 100, the electronic device 102 can communicate various data and control information bidirectionally with the base station 104 via the wireless interface 120. However, the electronic device 102 may communicate directly with other peer devices, an alternative wireless network, and the like.

As shown, the wireless interface 120 includes at least one communication processor 124, at least one transceiver 126, and at least one RFFE, which is illustrated as the RF front-end 128. These components process data information, control information, and signals associated with communicating information for the electronic device 102 over the antenna 122. The communication processor 124 may be implemented as a system-on-chip (SoC), a modem baseband processor, or a baseband radio processor (BBP) that enables a digital communication interface for data, voice, messaging, or other applications of the electronic device 102. The communication processor 124 includes a digital signal processor (DSP) or one or more signal-processing blocks (not shown) for encoding and modulating data for transmission and for demodulating and decoding received data. Additionally, the communication processor 124 may also manage (e.g., control or configure) aspects or operation of the transceiver 126, the RF front-end 128, and other components of the wireless interface 120 to implement various communication protocols or communication techniques.

The transceiver 126 includes circuitry and logic for filtering, amplification, channelization, and frequency translation. The frequency translation may include an up-conversion or a down-conversion of frequency that is performed in a single conversion operation, or through multiple conversion operations. The transceiver 126 can include filters, switches, amplifiers, mixers, and so forth for routing and conditioning signals that are transmitted or received via the antenna 122. Although not explicitly shown, the wireless interface 120 can also include a digital-to-analog converter (DAC) or an analog-to-digital converter (ADC) to convert between analog signals and digital signals. The DAC and the ADC can be implemented as part of the communication processor 124, as part of the transceiver 126, or separately from both of them.

The components or circuitry of the transceiver 126 can be implemented in any suitable fashion, such as combined transceiver logic or separately as respective receiver and transceiver entities. In some cases, the transceiver 126 is implemented with multiple or different sections to implement respective receiving and transmitting operations (e.g., separate transmit and receive chains). The transceiver 126 may also include logic to perform in-phase/quadrature (I/Q) operations, such as synthesis, phase correction, modulation, demodulation, and the like.

Generally, the RF front-end 128 includes one or more filters, switches, or amplifiers for conditioning signals received via the antenna 122 or signals to be transmitted via the antenna 122. As shown, the RF front-end 128 includes at least one phase shifter 130 (PS 130). The RF front-end 128 may also include other RF sensors and components, such as a peak detector, power meter, gain control block, antenna tuning circuit, diplexer, balun, and the like. Configurable components of the RF front-end 128, such as the phase shifter 130, may be controlled by the communication processor 124 to implement communications in various modes or different frequency bands. Although the phase shifter 130 is depicted as being part of an RF front-end 128, described implementations of a phase shifter 130 can alternatively be employed in other portions of the wireless interface 120 or of the electronic device 102 generally. Accordingly, the phase shifter 130 can implement at least one tunable passive phase shifter as described herein in different environments.

In example implementations, the antenna 122 is implemented as at least one antenna array that include multiple antenna elements. Thus, as used herein, an "antenna" can refer to an antenna array or an antenna element, depending on context. To implement beamforming, a respective phase shifter 130 is coupled to each respective antenna element of an antenna array. The phase shifter 130 shifts a phase of a signal to support, for instance, antenna beamforming with multiple antenna array branches, as described with reference to FIG. 2.

Figure 2:
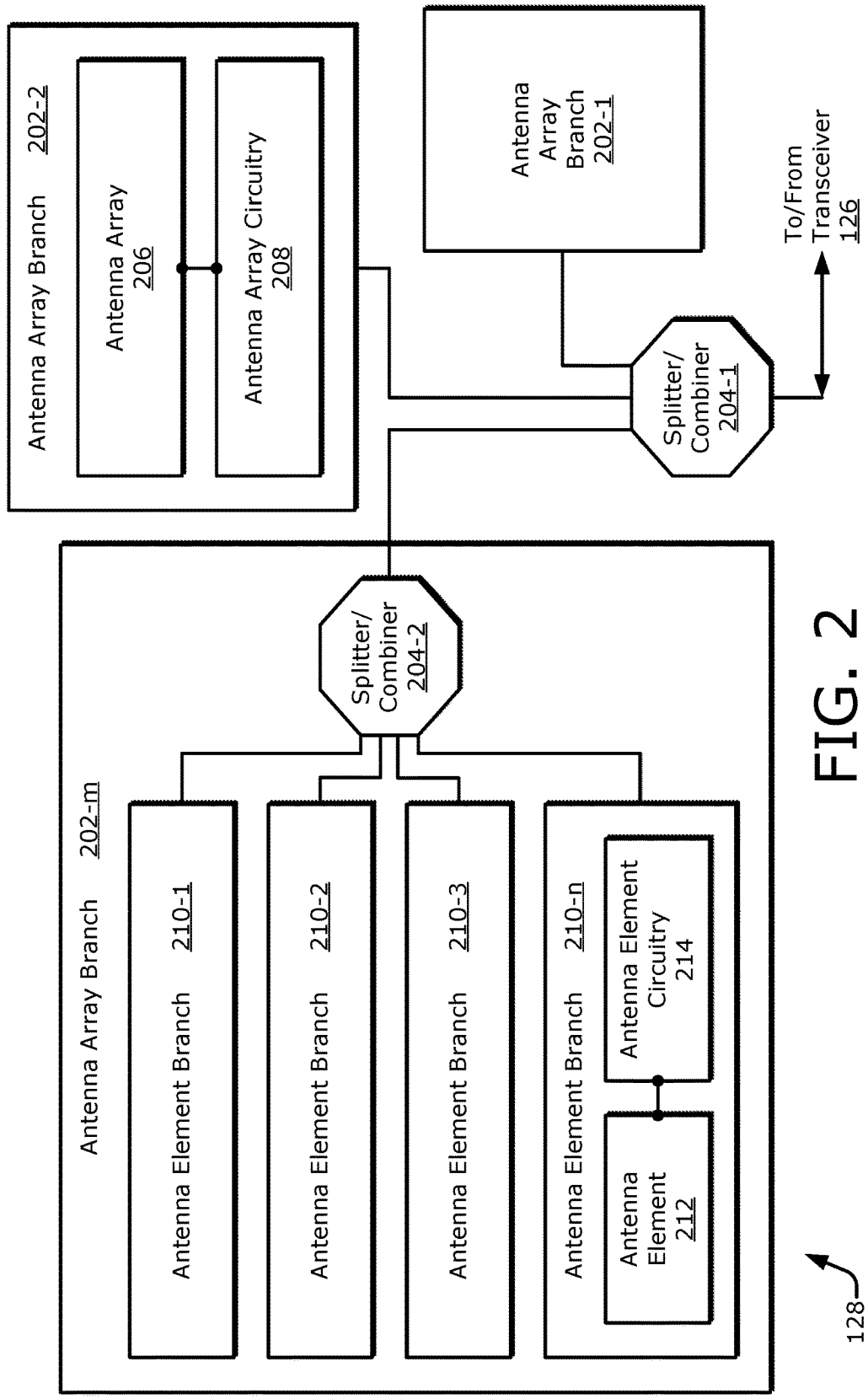
FIG. 2 illustrates an example radio-frequency front-end with multiple antenna array branches, each of which may include an antenna element branch.

FIG. 2 illustrates an example RF front-end 128 with multiple antenna array branches 202-1, 202-2 . . . 202-$m$, with "m" representing a positive integer. The RF front-end 128 also includes multiple splitter/combiners 204, two of which are shown—a first splitter/combiner 204-1 and a second splitter/combiner 204-2. The wireless interface 120 (of FIG. 1) can use the multiple antenna array branches 202-1, 202-2 . . . 202-$m$ to generate signal beams as part of an antenna beamforming scheme. In the example depicted in FIG. 2, "m" represents three. Thus, the first splitter/combiner 204-1 is coupled to three antenna array branches 202-1, 202-2, and 202-$m$ on one side. On another side, the first splitter/combiner 204-1 is coupled to the transceiver 126 to receive signals from, and provide signals to, the transceiver 126.

The components of each antenna array branch 202 may be logically organized in several manners. In one example manner, each antenna array branch 202 includes at least one antenna array 206 and corresponding antenna array circuitry 208, as illustrated at the second antenna array branch 202-2. From this perspective, an antenna array 206 of each respective antenna array branch 202 can be disposed in different respective locations of an electronic device 102, such as the top, the bottom, and one or both sides. The antenna array 206 can be implemented using any suitable antenna array, such as a patch antenna array.

In another logical manner, the components of each antenna array branch 202 may be organized into different antenna element branches, as illustrated in the mth antenna array branch 202-$m$. The mth antenna array branch 202-$m$ includes "n" antenna element branches 210-1, 210-2, 210-3 ... 210-*n* and the second splitter/combiner 204-2. The second splitter/combiner 204-2 is coupled to the first splitter/combiner 204-1 on one side and to each of the "n" antenna element branches on another side. As illustrated for the nth antenna element branch 210-*n*, each antenna element branch 210 includes at least one antenna element 212 and corresponding antenna element circuitry 214.

The antenna element 212 can be implemented as any suitable type of antenna element. Examples of the antenna element 212 include a patch antenna element, a dipole antenna element, a bowtie antenna element, a slot antenna element, or a cross-patch antenna element. The antenna elements 212 of the multiple antenna element branches 210-1 ... 210-*n* jointly correspond to an antenna array 206 (not explicitly shown) of the mth antenna array branch 202-*m*. The antenna element circuitry 214 interfaces the antenna element 212 with one or more splitter/combiners 204, and thus to the transceiver 126. The antenna element circuitries 214 of the multiple antenna element branches 210-1 ... 210-*n* jointly correspond to antenna array circuitry 208 (not explicitly shown) of the mth antenna array branch 202-*m*. Example implementations of the antenna element circuitry 214 are described below with reference to FIG. 3.

Figure 3:
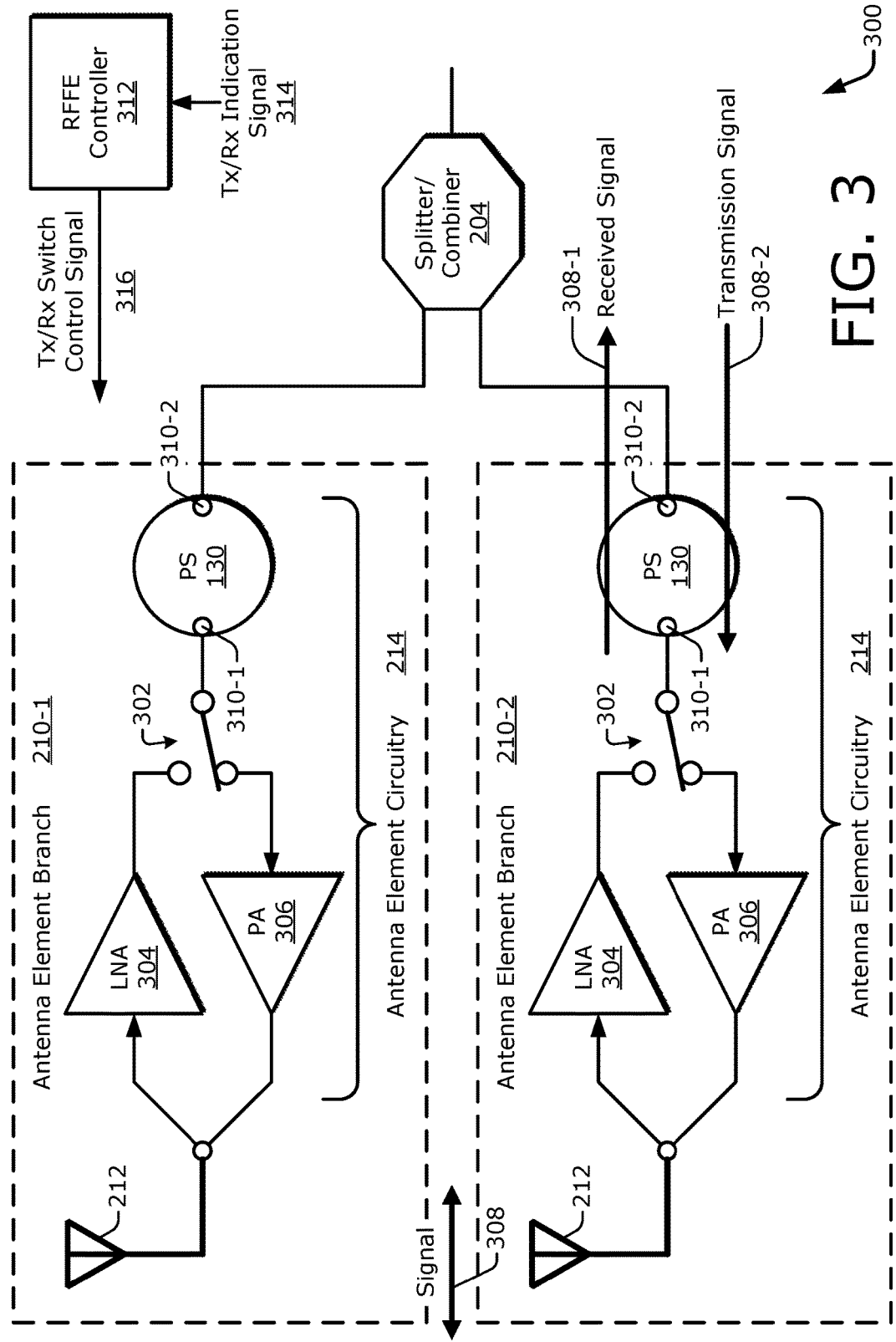
FIG. 3 illustrates example antenna element branches that each include an antenna element and a tunable passive phase shifter.

FIG. 3 illustrates, at 300 generally, example antenna element branches 210-1 and 210-2 that each include an antenna element 212 and antenna element circuitry 214. A splitter/combiner 204 and an RFFE controller 312 are also depicted. As shown for each antenna element branch 210, the antenna element circuitry 214 includes multiple amplifiers, a switch 302, and a phase shifter 130. The phase shifter 130 includes a first port 310-1 and a second port 310-2. The multiple amplifiers include a low-noise amplifier 304 (LNA 304) to amplify received signals and a power amplifier 306 (PA 306) to amplify transmission signals. The low-noise amplifier 304 and the power amplifier 306 are coupled to the antenna element 212 (e.g., via a diplexer) on one side and to the switch 302 on another side. The switch 302 is coupled to the phase shifter 130 via the first port 310-1. Thus, the amplifiers are switchably coupled to the phase shifter 130. The phase shifter 130 is coupled to the splitter/combiner 204 via the second port 310-2.

In some implementations, the phase shifter 130 is realized as a tunable passive phase shifter in which signals can propagate in both directions through the phase shifter 130. As shown on the left, a signal 308 is transceived via the multiple antenna elements of the multiple antenna element branches 210-1 to 210-*n*, two of which are shown in FIG. 3. The signal 308 can comprise a received signal 308-1 or a transmission signal 308-2, as depicted with respect to the second antenna element branch 210-2 by way of example. The received signal 308-1 can enter the phase shifter 130 at the first port 310-1 and exit at the second port 310-2 at one time. The transmission signal 308-2, on the other hand, can enter the phase shifter 130 at the second port 310-2 and exit at the first port 310-1 at another time. Example circuit-level implementations for the phase shifter 130 are described below, starting at FIG. 4-1.

The switch 302 can be placed in a transmit state or a receive state. In the receive state, the switch 302 couples the phase shifter 130 to the low-noise amplifier 304 to provide the received signal to the phase shifter 130 from the low-noise amplifier 304. In the transmit state, the switch 302 couples the phase shifter 130 to the power amplifier 306 to provide the transmission signal 308-2 from the phase shifter 130 to the power amplifier 306. Thus, the switch 302 and the amplifiers are responsible for coupling the signal 308 to or from the antenna element 212 for transmission or reception, respectively. The switch 302 is therefore controlled based on whether the transceiver 126 is in a transmit mode or a receive mode, at least with respect to the signal 308. The transmit mode or the receive mode can be signified by a transmit/receive indication signal 314 (Tx/Rx Indication Signal 314). In some implementations, the RFFE controller 312, or controller 312, can control various switch states or other operations of the RF front-end 128. In operation, the RFFE controller 312 accepts the transmit/receive indication signal 314. Based on the transmit/receive indication signal 314, the RFFE controller 312 generates a transmit/receive switch control signal 316 (Tx/Rx Switch Control Signal 316). The RFFE controller 312 provides the transmit/receive switch control signal 316 to each switch 302 to cause a given switch 302 to be in the transmit state or the receive state.

The RFFE controller 312 can include at least one processor and CRM, which stores computer-executable instructions (such as the application processor 108, the CRM 110, and the instructions 112). The processor and the CRM can be localized at one module or one integrated circuit chip or can be distributed across multiple modules or chips. Together, a processor and associated instructions can be realized in separate circuitry, fixed logic circuitry, hard-coded logic, and so forth. The RFFE controller 312 can be implemented as part of the wireless interface 120, the application processor 108, a general-purpose processor, some combination thereof, and so forth. For example, the RFFE controller 312 can be implemented as part of the communication processor 124. In general, the RFFE controller 312 controls the RF front-end 128.

Figures 1, 4:
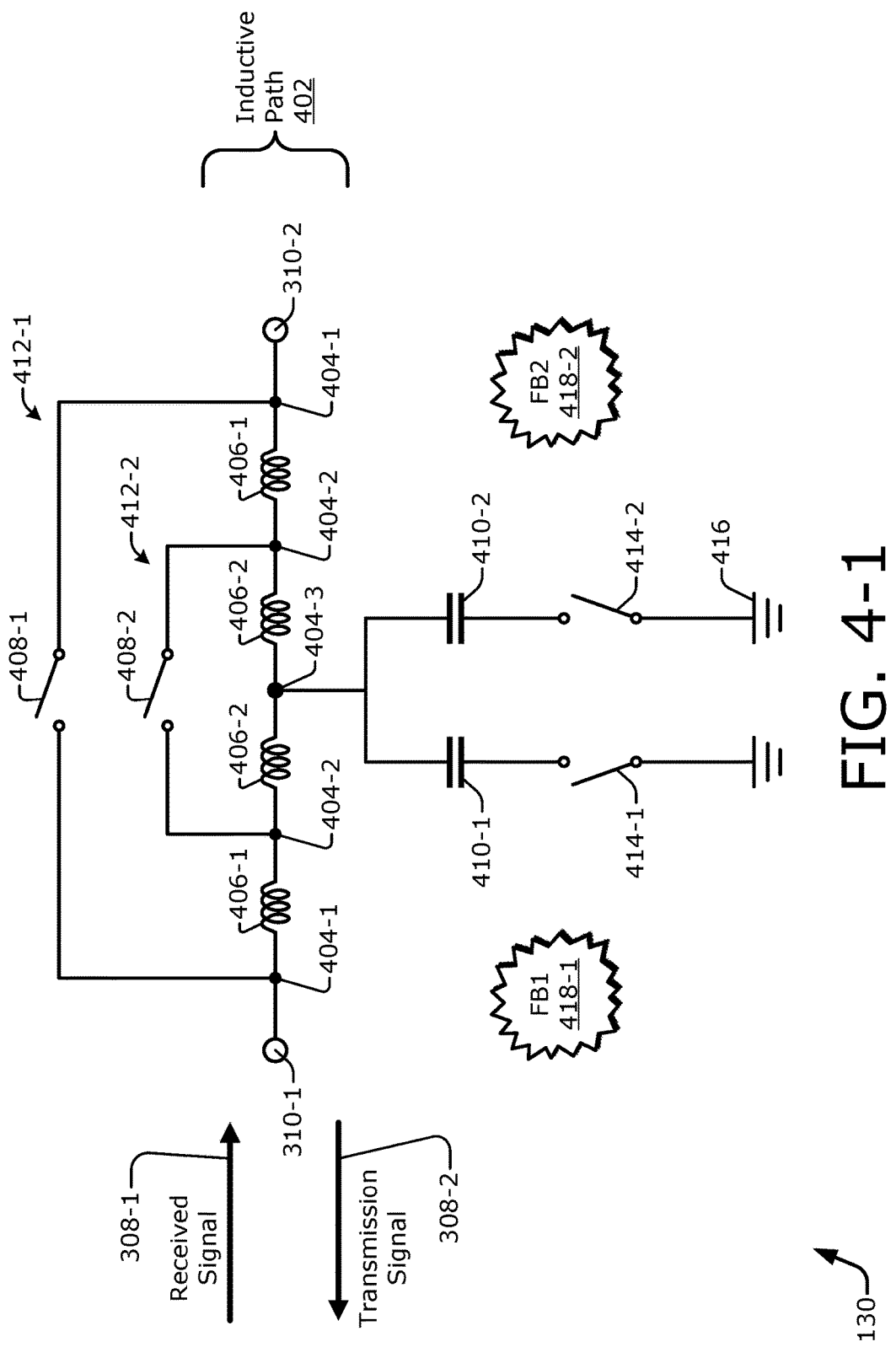
Figures 2, 4:
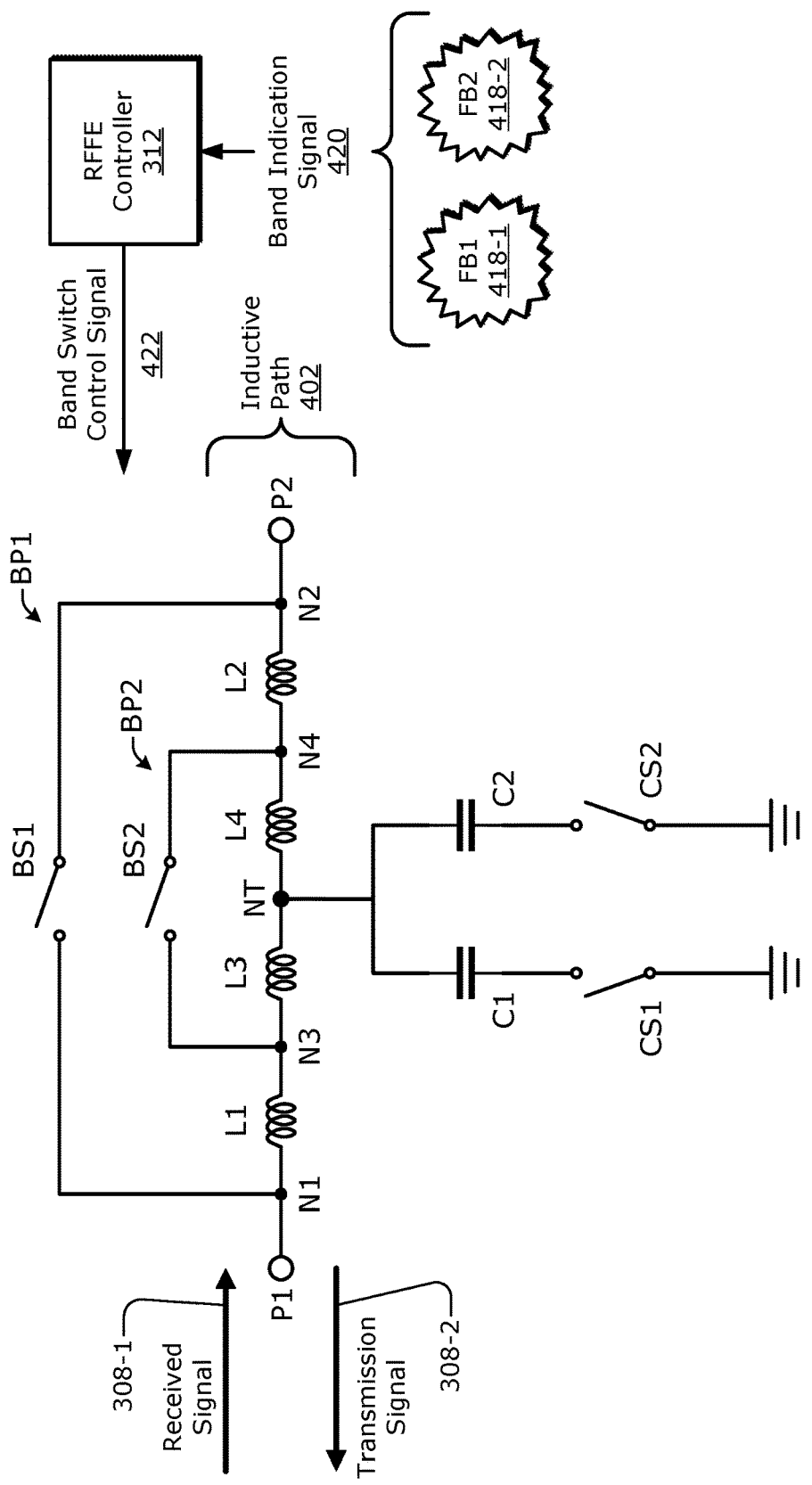

FIG. 4-1 is a circuit diagram illustrating an example tunable passive phase shifter with multiple inductors and at least one bypass path. As shown, the example phase-shifter 130 includes multiple ports 310-1 and 310-2 and an inductive path 402. The inductive path 402 is coupled between a first port 310-1 and a second port 310-2. The received signal 308-1 can enter the phase shifter 130 via the first port 310-1, propagate over the inductive path 402, and exit via the second port 310-2. The transmission signal 308-2, on the other hand, can enter the phase shifter 130 via the second port 310-2, propagate over the inductive path 402, and exit via the first port 310-1.

The inductive path 402 includes multiple nodes 404 and multiple inductors 406 that are interleaved with each other along the inductive path 402 (e.g., that are alternated along the inductive path 402). The multiple inductors 406 are coupled together in series between the first port 310-1 and the second port 310-2. To accommodate multiple different frequency bands with the inductive path 402, at least one bypass path 412 is coupled along the inductive path 402 at two different nodes 404 thereof (e.g., at a pair of nodes 404-1 or a pair of nodes 404-2). In some implementations, multiple bypass paths 412-1 and 412-2 are coupled to different pairs of nodes 404 of the inductive path 402. The multiple bypass paths include a first bypass path 412-1 and a second bypass path 412-2. The first bypass path 412-1 includes a first bypass switch 408-1, and the second bypass path 412-2 includes a second bypass switch 408-2.

In some implementations, the multiple nodes 404 of the inductive path 402 can be separated into at least three sets of nodes: a first pair of nodes 404-1, a second pair of nodes 404-2, and a tap node 404-3. The first pair of nodes 404-1 can correspond to the first port 310-1 and the second port 310-2, as shown. Alternatively, one or more components may be coupled between a port 310 and an adjacent node of the first pair of nodes 404-1. The first bypass path 412-1 is coupled across at least a portion of the inductive path 402 via the first pair of nodes 404-1. The second bypass path 412-2 is coupled across a portion of the inductive path 402 via the second pair of nodes 404-2, with the portion inclusive of at least one inductor 406 (e.g., inclusive of at least one inductor of a second pair of inductors 406-2) and exclusive of at least one other inductor 406 (e.g., exclusive of at least one inductor of a first pair of inductors 406-1).

As depicted in FIG. 4-1, the multiple inductors 406 are separated into at least two sets: a first pair of inductors 406-1 and a second pair of inductors 406-2. Starting on the left at the first port 310-1 and moving rightward, one inductor of the first pair of inductors 406-1 is coupled between one node of the first pair of nodes 404-1 (e.g., which corresponds to the first port 310-1 as shown) and one node of the second pair of nodes 404-2. One inductor of the second pair of inductors 406-2 is coupled between the one node of the second pair of nodes 404-2 and the tap node 404-3. Another inductor of the second pair of inductors 406-2 is coupled between the tap node 404-3 and another node of the second pair of nodes 404-2. Also, another inductor of the first pair of inductors 406-1 is coupled between the other node of the second pair of nodes 404-2 and another node of the first pair of nodes 404-1 (e.g., which corresponds to the second port 310-2 as shown).

Thus, each inductor of the second pair of inductors 406-2 is coupled to the other via the tap node 404-3 and in series with each other relative to the second pair of nodes 404-2. The second bypass path 412-2 is coupled in parallel with the second pair of inductors 406-2 at the second pair of nodes 404-2. Each inductor of the first pair of inductors 406-1 is coupled on either side of the series-coupled inductors of the second pair of inductors 406-2. The four inductors of the first pair of inductors 406-1 and the second pair of inductors 406-2 are coupled together in series with respect to the first pair of nodes 404-1. The first bypass path 412-1 is coupled in parallel with these four inductors at the first pair of nodes 404-1 or at the first and second ports 310-1 and 310-2. Also, the tap node 404-3 can correspond to a center tap node for the inductive path 402 or for the four inductors forming at least part of the inductive path 402.

The phase shifter 130 also includes multiple capacitors 410: a first capacitor 410-1 and a second capacitor 410-2. Each of the first and second capacitors 410-1 and 410-2 are coupled to the tap node 404-3. The tap node 404-3 can be implemented as a central tap node along the inductive path 402 such that an equal quantity of inductors of the multiple inductors 406 is disposed on each side of the central tap node. The first capacitor 410-1 and the second capacitor 410-2 are coupled in parallel with each other between the tap node 404-3 and a ground 416, which represents some voltage equipotential of the circuit or of the wireless interface generally. Specifically, the first capacitor 410-1 is coupled in series with a first capacitor switch 414-1 between the tap node 404-3 and the ground 416, and the second capacitor 410-2 is coupled in series with a second capacitor switch 414-2 between the tap node 404-3 and the ground 416. In some implementations, each respective capacitor of the first and second capacitors 410-1 and 410-2 is associated with a respective frequency band of multiple frequency bands 418. Thus, the first capacitor 410-1 can be associated with a first frequency band 418-1 (FB1 418-1), and the second capacitor 410-2 can be associated with a second frequency band 418-2 (FB2 418-2).

In example implementations, the phase shifter 130 can be selectively operated in one of various modes, such as an engagement mode, a disengagement mode, a first frequency-band mode, a second frequency-band mode, or some combination thereof. In operation, to disengage the phase shifter 130 for the disengagement mode (e.g., a null frequency band mode), the first bypass switch 408-1 is closed. Thus, a signal propagates along the first bypass path 412-1 and therefore detours around, and is substantially unaffected by, the multiple inductors 406 of the inductive path 402. In these manners, the first bypass path 412-1 provides an example bypass mechanism for disengaging the multi-band phase shifter (e.g., the phase shifter 130 illustrated in FIG. 4-1), with the bypass mechanism for disengaging coupled to the first port 310-1 and the second port 310-2.

For the engagement mode, the phase shifter 130 can be operated in the first frequency-band mode or the second frequency-band mode. In this example, the first frequency band 418-1 of the first frequency-band mode has a relatively lower frequency than the second frequency band 418-2 of the second frequency-band mode. To engage the phase shifter 130 for the first frequency band 418-1, the first bypass switch 408-1 and the second bypass switch 408-2 are both in an open state. Further, the first capacitor switch 414-1 in series with the first capacitor 410-1 is placed in a closed state, but the second capacitor switch 414-2 is placed in an open state. Thus, for the first frequency band 418-1, a propagating signal travels along the entirety of the inductive path 402 (e.g., across all the multiple inductors 406-1 and 406-2 in the illustrated example) and the first capacitor 410-1 provides impedance matching. Alternatively, the first and second capacitors 410-1 and 410-2 can be jointly used for the first frequency-band mode. To share these two capacitors, the first capacitor switch 414-1 and the second capacitor switch 414-2 are both placed in a closed state. The first and second capacitors 410-1 and 410-2 are therefore coupled in parallel with each other in this alternative for the first frequency band 418-1 to achieve a targeted impedance match using both capacitors. This approach enables the first capacitor 410-1 to be smaller and therefore occupy less space by leveraging a capacitance of the second capacitor 410-2 for the lower frequency of the first frequency band 418-1.

To engage the phase shifter 130 for the higher, second frequency band 418-2, the first bypass switch 408-1 is placed in an open state, but the second bypass switch 408-2 is closed. The second capacitor switch 414-2 in series with the second capacitor 410-2 is placed in a closed state, but the first capacitor switch 414-1 is opened. After closing the second capacitor switch 414-2 and opening the first capacitor switch 414-1, the second capacitor 410-2 can provide impedance matching. With the two bypass switches 408-1 and 408-2 in these states, a propagating signal travels along the two inductors of the first pair of inductors 406-1 but "detours" around the two inductors of the second pair of inductors 406-2 by traveling substantially along the second bypass path 412-2. In these manners, the second bypass path 412-2 provides an example bypass mechanism for switching a frequency band 418 to which a multi-band phase shifter 130 is tuned, with the bypass mechanism coupled to the second pair of nodes 404-2 and configured to selectively enable a signal detour around a portion of the multiple inductors (e.g., around the second pair of inductors 406-2). Thus, the bypass mechanism can adjust a frequency response provided by the multi-band phase shifter 130.

In the second frequency-band mode, the two inductors of the second pair of inductors 406-2 are coupled together in parallel between the tap node 404-3 and a shorted, or combined, version of the second pair of nodes 404-2 (due to the second bypass switch 408-2 being in a closed state). This combined inductance from the second pair of inductors 406-2 is manifested as a series inductance with respect to the second capacitor 410-2. To compensate for this series inductance, a capacitance (or capacitive value) of the second capacitor 410-2 is set slightly larger than it otherwise would be to meet the capacitance target for the impedance match of the phase shifter 130. For the various implementations described herein for using the first and/or second capacitors 410-1 and 410-2 individually or jointly, the switched capacitive circuitry between the tap node 404-3 and the ground 416 provides an example capacitor mechanism for combining a capacitance (e.g., of the first and/or second capacitors 410-1 and 410-2) with an inductance of at least a portion of the multiple inductors (e.g., one or more inductors selected from those of the first and second pairs of inductors 406-1 and 406-2) to match an impedance of a component coupled to the multi-band phase shifter.

The impedance values of the multiple inductors 406 can be determined based on a targeted phase shift for the phase shifter 130 and a frequency band of interest for each mode, as shown in the following two equations:

$$L2 := Zo \cdot \tan\left(\left|\frac{\phi}{2}\right|\right) \cdot \left(\frac{\omega 2 - \omega 1}{\omega 2 \cdot \omega 2}\right)$$

$$L1 := \frac{Zo \cdot \tan\left(\left|\frac{\phi}{2}\right|\right)}{\omega 2}.$$

In the equations above, the variable "L1" corresponds to a first value of a first inductance of each inductor of the first pair of inductors 406-1, and the variable "L2" corresponds to a second value of a second inductance of each inductor of the second pair of inductors 406-2. The variable "Zo" denotes an impedance for matching (e.g., at 50 or 100 Ohms) with adjacent components that are coupled to the phase shifter 130 at the first port 310-1 or the second port 310-2. The variable "φ" represents a targeted phase shift, such as 22.5, 45, or 90 degrees (or, e.g., any other phase shift amount such as 5, 67, or 270 degrees). A respective center frequency of the first frequency band 418-1 and the second frequency band 418-2 is represented in radians by "ω1" and "ω2," respectively.

In this manner, the first pair of inductors 406-1 are reused for the phase shifter 130 to phase shift signals for both the first frequency band 418-1 and the second frequency band 418-2. Thus, a multi-band (e.g., a dual band) passive phase shifter is realized that reuses some inductive elements between or among frequency bands to reduce area consumption by inductive elements. Further, a quantity of switches along a signal propagation path, which switches contribute to insertion loss, is lowered as compared to approaches that place a switch in series with an inductor.

In alternative aspects, a tri-band passive phase shifter can be implemented. For example, a third pair of inductors can be included along the inductive path 402 on either side of the first pair of inductors 406-1. A third bypass path, which enables a signal to detour around the three pairs of inductors, is included to switchably couple the first and second ports 310-1 and 310-2 to enable engagement and disengagement modes for the tri-band passive phase shifter. In such implementations, the first bypass switch 408-1 is then used to enable a frequency-band while in the engagement mode. Tunable passive phase shifters with more than three frequency bands may be implemented in analogous manners.

FIG. 4-2 is another circuit diagram illustrating an example tunable passive phase shifter in conjunction with an RFFE controller 312. In FIG. 4-1, the multiple nodes 404 and inductors 406 of the phase shifter 130 are labeled in terms of pairs. In contrast, in FIG. 4-2 each node and inductor is individually labeled. Thus, the example inductive path 402 includes five nodes: a first node N1, a second node N2, a third node N3, a fourth N4, and a tap node NT. The inductive path 402 also includes four inductors between a first port P1 and a second port P2: a first inductor L1, a second inductor L2, a third inductor L3, and a fourth inductor L4. The phase shifter 130 also includes a first bypass path BP1, a second bypass path BP2, a first bypass switch BS1, and a second bypass switch BS2. The phase shifter 130 further includes a first capacitor C1, a second capacitor C2, a first capacitor switch CS1, and a second capacitor switch CS2.

With reference also to FIG. 4-1, the first pair of nodes 404-1 corresponds to the first and second nodes N1 and N2. The second pair of nodes 404-2 corresponds to the third and fourth nodes N3 and N4. The first pair of inductors 406-1 corresponds to the first and second inductors L1 and L2. The second pair of inductors 406-2 corresponds to the third and fourth inductors L3 and L4. The tap node 404-3 corresponds to the tap node NT. The first and second bypass switches 408-1 and 408-2 correspond to the first and second bypass switches BS1 and BS2. And the first and second bypass paths 412-1 and 412-2 correspond to the first and second bypass paths BP1 and BP2. The first and second capacitors 410-1 and 410-2 correspond to the first and second capacitors C1 and C2. Also, the first and second capacitor switches 414-1 and 414-2 correspond to the first and second capacitor switches CS1 and CS2.

As shown in FIG. 4-2, the four inductors L1-L4 are coupled together in series between the first and second ports P1 and P2 in an interleaved manner with respect to the five nodes N1-N4 and NT (e.g., wherein positions of the inductors are alternated with positions of the nodes along the inductive path 402). From left-to-right, between the first port P1 and the second port P2, the inductors are coupled together in series as follows: the first inductor L1, the third inductor L3, the fourth inductor L4, and the second inductor L2. Also from left-to-right, the five nodes are positioned as follows: the first node N1, the third node N3, the tap node NT, the fourth node N4, and the second node N2. The first inductor L1 is coupled between the first node N1 and the third node N3. The third inductor L3 is coupled between the third node N3 and the tap node NT. The fourth inductor L4 is coupled between the tap node NT and the fourth node N4. And the second inductor L2 is coupled between the fourth node N4 and the second node N2.

In some implementations, a controller, such as the RFFE controller 312, controls switch states of the switches of the RF front-end 128. For example, the RFFE controller 312 can generate at least one band switch control signal 422 responsive to a band indication signal 420. For a dual-band scenario, the band indication signal 420 can correspond to the first frequency band 418-1 or the second frequency band 418-2. Responsive to the frequency-band indication, the RFFE controller 312 generates at least one band switch control signal 422 to cause the switches to be in a state appropriate for the indicated frequency band (including no frequency band or the null frequency band for the disengagement mode). Switch states and corresponding frequency bands are depicted in FIG. 5 and described below.

Regarding the switches of the phase shifter 130, each switch can be in an open state or a closed state, depending on whether current is prevented from flowing or permitted to flow, respectively. Thus, each switch can be implemented using, for example, a transistor that is turned on and permitting current to flow for the closed state and that is turned off and preventing current from flowing for the open state. A transistor can be realized using a metal-oxide-semiconductor (MOS) field-effect transistor (FET), or MOSFET; a junction field-effect transistor (JFET); a bipolar junction transistor (BJT); and so forth. For example, a switch can comprise an n-channel metal-oxide-semiconductor field-effect transistor (NMOSFET) or a p-channel metal-oxide-semiconductor field-effect transistor (PMOSFET) and can have a thin or a thick oxide layer. In these instances, at least one band switch control signal 422 can be coupled to a gate terminal of a MOSFET to bias the transistor into an on state or an off state to close or open a switch, respectively.

Figure 5:
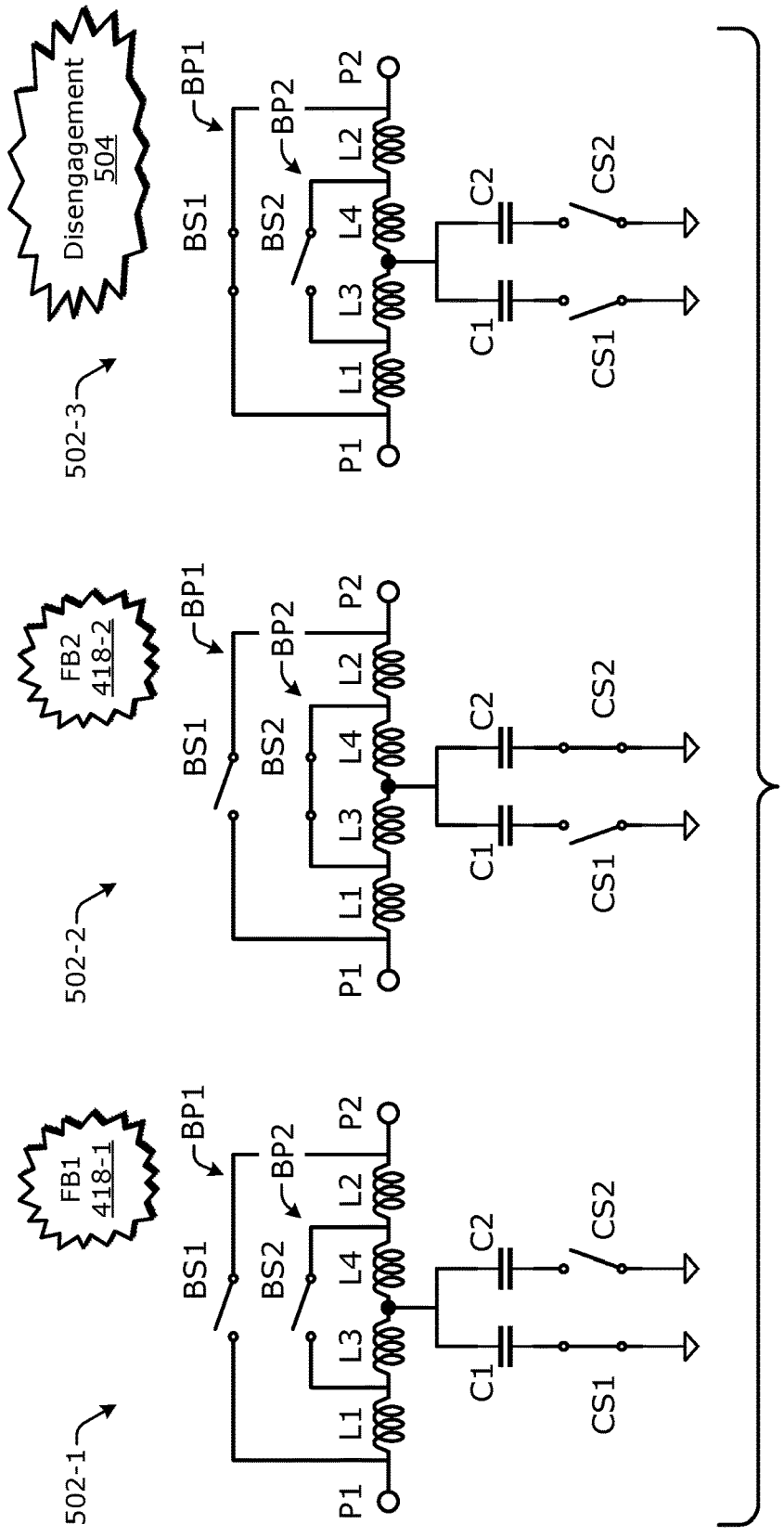
FIG. 5 illustrates three example modes of a tunable passive phase shifter with the modes corresponding to a first frequency band, a second frequency band, and a disengaged condition.

FIG. 5 illustrates, at 500 generally, three example modes 502-1, 502-2, and 502-3 of a tunable passive phase shifter with the modes respectively corresponding to the first frequency band 418-1, the second frequency band 418-2, and a disengagement condition 504. As described above with reference to FIG. 4-2, at least one band switch control signal 422 can control the states of the various switches of a phase shifter. Thus, two or more values of the band switch control signal 422 can correspond to the first frequency band 418-1, the second frequency band 418-2, or no frequency band (for the disengagement condition 504).

In operation, the RFFE controller 312 can generate the band switch control signal 422 to cause the various switches to enter a desired state to establish a corresponding mode 502. Thus, in these manners, the RFFE controller 312 provides an example control mechanism for controlling a bypass mechanism (e.g., a second bypass path BP2) for switching frequency bands 418 responsive to at least one band indication signal 420 and for controlling a bypass mechanism (e.g., a first bypass path BP1) for disengaging a multi-band phase shifter responsive to at least one bit control signal (e.g., a bit control signal 704, which is described below with reference to FIG. 7).

In a first frequency-band mode 502-1, the first bypass switch BS1, the second bypass switch BS2, and the second capacitor switch CS2 are in the open state. The first capacitor switch CS1 is in the closed state. Accordingly, the first capacitor C1 can provide capacitance for impedance matching. Further, a propagating signal 308 (e.g., of FIG. 3) cannot travel over either bypass path, so the signal 308 propagates over the four inductors L1, L3, L4, and L2 from the first port P1 to the second port P2, or vice versa.

In a second frequency-band mode 502-2, the first bypass switch BS1 and the first capacitor switch CS1 are in the open state. On the other hand, both the second capacitor switch CS2 and the second bypass switch BS2 are in the closed state. Accordingly, the second capacitor C2 can provide capacitance for impedance matching. Further, a propagating signal 308 can travel over the second bypass path BP2 by detouring around the two inductors L3 and L4. Consequently, the signal 308 propagates over the two inductors L1 and L2 between the two ports P1 and P2.

In a disengagement mode 502-3, the second bypass switch BS2, the first capacitor switch CS1, and the second capacitor switch CS2 are in the open state. However, the first bypass switch BS1 is in the closed state. Accordingly, a propagating signal can substantially avoid the four inductors L1, L3, L4, and L2. Thus, the signal 308 travels over the first bypass path BP1 by detouring around the four inductors L1-L4. Alternatively, the second bypass switch BS2 can also be in a closed state for the disengagement mode 502-3, especially if the resulting performance is superior (e.g., is more predictable or consistent, produces less noise, or has lower insertion loss). The disengagement condition 504 can be instituted to deactivate a phase-shift unit of a multi-bit phase shifter, which is described below with reference to FIG. 7.

FIG. 6 depicts, at 600 generally, two circuit diagrams illustrating two alternative implementations for a tunable passive phase shifter. With an example circuit 602, the first bypass path BP1 is omitted. This omission eliminates at least one transistor and an additional wire trace and can reduce insertion loss further. The circuit 602 can be used if, for example, an associated RF front-end 128 does not employ a disengagement mode 502-3 of FIG. 5. Thus, the circuit 602 can be employed, for instance, in scenarios that do not involve a multi-bit phase shifter.

In contrast, an example circuit 604 can be employed as part of a multi-bit phase shifter. The circuit 604 includes a first bypass path BP1 with a first bypass switch BS1 similar to FIGS. 4-1 and 4-2. The circuit 604 differs from those of FIGS. 4-1 and 4-2 with regard to the second bypass path BP2. Instead of one bypass switch along the second bypass path BP2, the bypass path BP2 includes two bypass switches: a second bypass switch BS2 and a third bypass switch BS3. With respect to the third node N3 and the fourth node N4, the second and third bypass switches BS2 and BS3 are coupled together in series along the second bypass path BP2. However, each bypass switch is also coupled to the tap node NT. More specifically, the second bypass switch BS2 is coupled between the third node N3 and the tap node NT, and the third bypass switch BS3 is coupled between the fourth node N4 and the tap node NT. This approach to the bypass path BP2 provides a more symmetrical, balanced implementation of a tunable phase shifter. In operation, both the second and third bypass switches BS2 and BS3 are closed for the second frequency band 418-2 and opened for the first frequency band 418-1. The symmetrical implementation of the circuit 604 is employed in an example multi-bit phase shifter as described with reference to FIG. 7. However, the implementation of FIG. 4-2 can alternatively be used in the example multi-bit phase shifter of FIG. 7.

Figure 7:
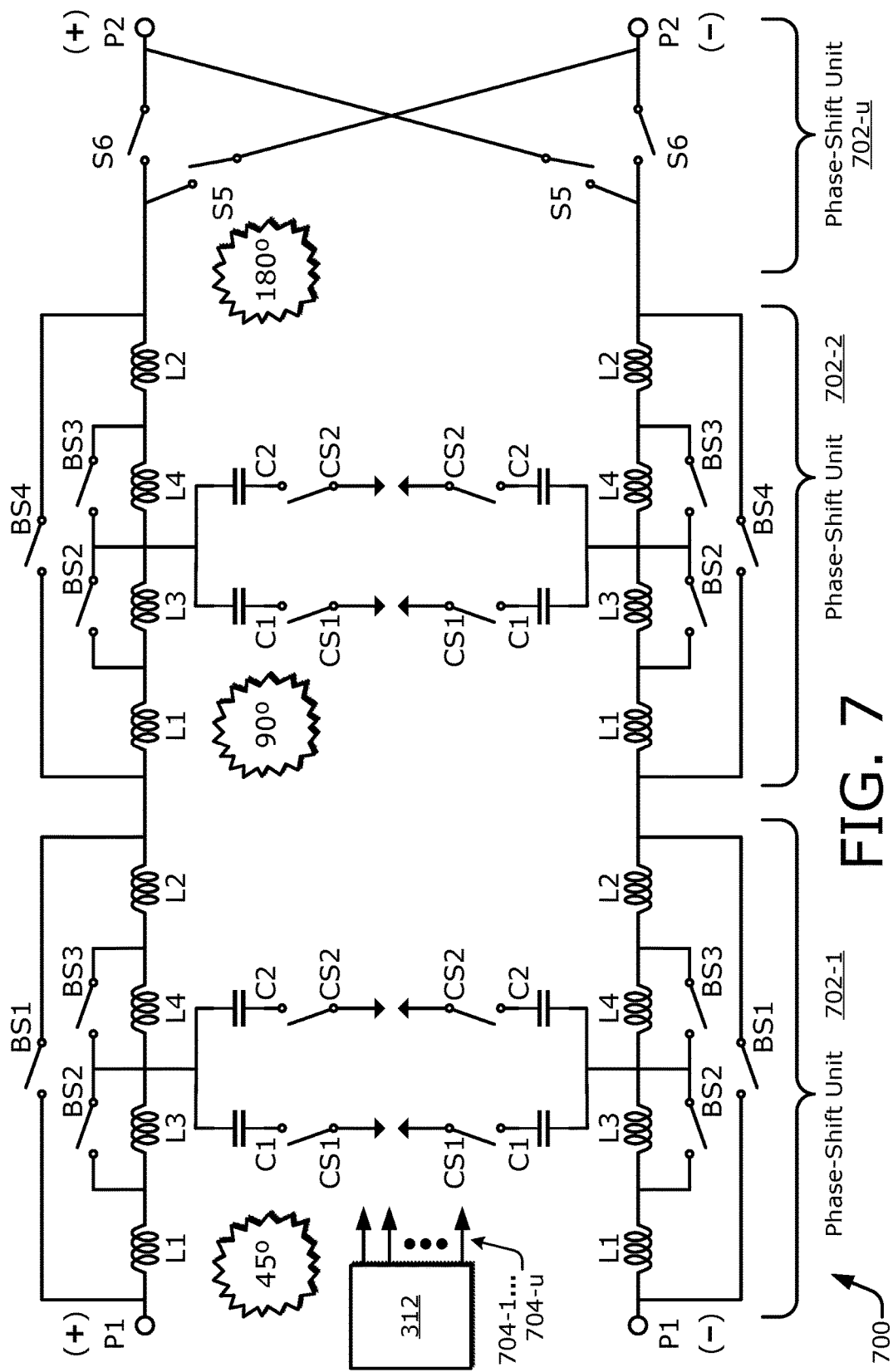
FIG. 7 illustrates an example multi-bit multi-band phase shifter having multiple phase-shift units, some of which are formed from at least one tunable passive phase shifter and each of which can propagate a differential signal.

FIG. 7 illustrates a phase shifter implemented as multi-bit multi-band phase shifter 700 having multiple phase-shift units 702-1 to 702-$u$, with "u" representing a positive integer. Each phase-shift unit 702 shifts a phase by a different phase-shift amount of multiple phase-shift amounts—e.g., by a different number of degrees, such as 22.5, 45, 60, 90, and 180 degrees. In the example shown, the phase-shift unit 702-1 shifts phases by 45 degrees, the phase-shift unit 702-2 shifts phases by 90 degrees, and the phase-shift unit 702-$u$ shifts phases by 180 degrees. Thus, in the illustrated multi-bit multi-band phase shifter 700, the variable "u" corresponds to three (3), and the example illustrated multi-bit multi-band phase shifter 700 comprises a three-bit tunable phase shifter. To provide the bit control, the RFFE controller provides "u" bit control signals 704-1 . . . 704-$u$ to engage or disengage respective ones of the multiple phase-shift units 702-1 . . . 702-$u$.

Each of the first and second phase-shift units 702-1 and 702-2 includes at least one tunable passive phase shifter having at least four inductors L1, L2, L3, and L4 apiece. With single-ended signaling, the multi-bit multi-band phase shifter 700 can be implemented with one multi-band passive phases shifter per phase-shift unit 702. However, the multi-bit multi-band phase shifter 700 is implemented as a differential multi-bit multi-band phase shifter having two signal paths, a plus differential signal path and a minus differential signal path. Accordingly, each phase-shift unit 702 (besides the phase-shift unit 702-$u$) includes two tunable passive phase shifters—one for each differential signal path. The plus differential signal path includes a plus first port P1(+) and a plus second port P2(+). The minus differential signal path includes a minus first port P1(−) and a minus second port P2(−). Thus, each phase-shift unit 702 can propagate a differential signal.

The uth phase-shift unit 702-*u* is discussed first, and the other phase-shift units are discussed below. The uth phase-shift unit 702-*u* shifts phases by 180 degrees and includes four switches: two fifth switches S5 and two sixth switches S6. The fifth switches S5 and the sixth switches S6 are controlled by a third bit control signal (e.g., bit control signal 704-*u*) to engage or disengage the phase-shift unit 702-*u*. The fifth switches S5 are placed in the open state, and the sixth switches S6 are placed in the closed state to disengage the 180-degree phase-shift unit 702-*u*. To engage the 180-degree phase-shift unit 702-*u*, the fifth switches S5 are placed in the closed state, and the sixth switches S6 are placed in the closed state.

Values for the components of the first and second phase-shift units 702-1 and 702-2 of the multi-bit multi-band phase shifter 700 can be determined using the equations provided above with reference to FIG. 4-1. Here, the phase shift amounts (corresponding to the variable "$\varphi$," which represents a targeted phase shift in the equations above) are 45 and 90 degrees, respectively, for the first and second phase-shift units 702-1 and 702-2. Accordingly, the inductors and capacitors in the different first and second phase-shift units 702-1 and 702-2 may have different inductive and capacitive values based on the different targeted phase shifts, even if the reference designations are identical. For example, a first inductor L1 of the first phase-shift unit 702-1 can have a different inductive value than a first inductor L1 of the second phase-shift unit 702-2, and a second capacitor C2 of the first phase-shift unit 702-1 can have a different capacitive value than a second capacitor C2 of the second phase-shift unit 702-2. The two frequency bands for which the multi-bit multi-band phase shifter 700 is configured can have any frequency range. However, in some implementations, a center of the first frequency band is approximately half of a center of the second frequency band to have approximately a 1:2 frequency ratio. By way of example, the first frequency band can have a center frequency of approximately 26 GHz, and the second frequency band can have a center frequency of approximately 40 GHz.

In operation, the second and third bypass switches BS2 and BS3 are controlled by a band switch control signal 422 (e.g., of FIG. 4-2) that is responsive to a band indication signal 420 as described above with reference to FIGS. 4-2 and 6. The first and fourth bypass switches BS1 and BS4 correspond to first and second bit control signals of the multiple bit control signals 704-1 . . . 704-*u*. To disengage the first phase-shift unit 702-1, the RFFE controller 312 uses the first bit control signal 704-1 to close the two first bypass switches BS1 that are disposed along the plus and minus differential signal paths of the first phase-shift unit 702-1. To engage the first phase-shift unit 702-1, the RFFE controller 312 opens the two first bypass switches BS1 that are disposed along the plus and minus signal paths using the first bit control signal 704-1. While engaged, the band switch control signal 422 can control switch states of the second and third bypass switches BS2 and BS3 and switch states of the first and second capacitor switches CS1 and CS2 to configure the first phase-shift unit 702-1 for the first or second frequency band, as described above. The RFFE controller 312 operates the second phase-shift unit 702-2 analogously, except that the two fourth bypass switches BS4 are controlled by another bit signal 704 to disengage or engage the 90-degree phase shifting.

Figures 1, 8:
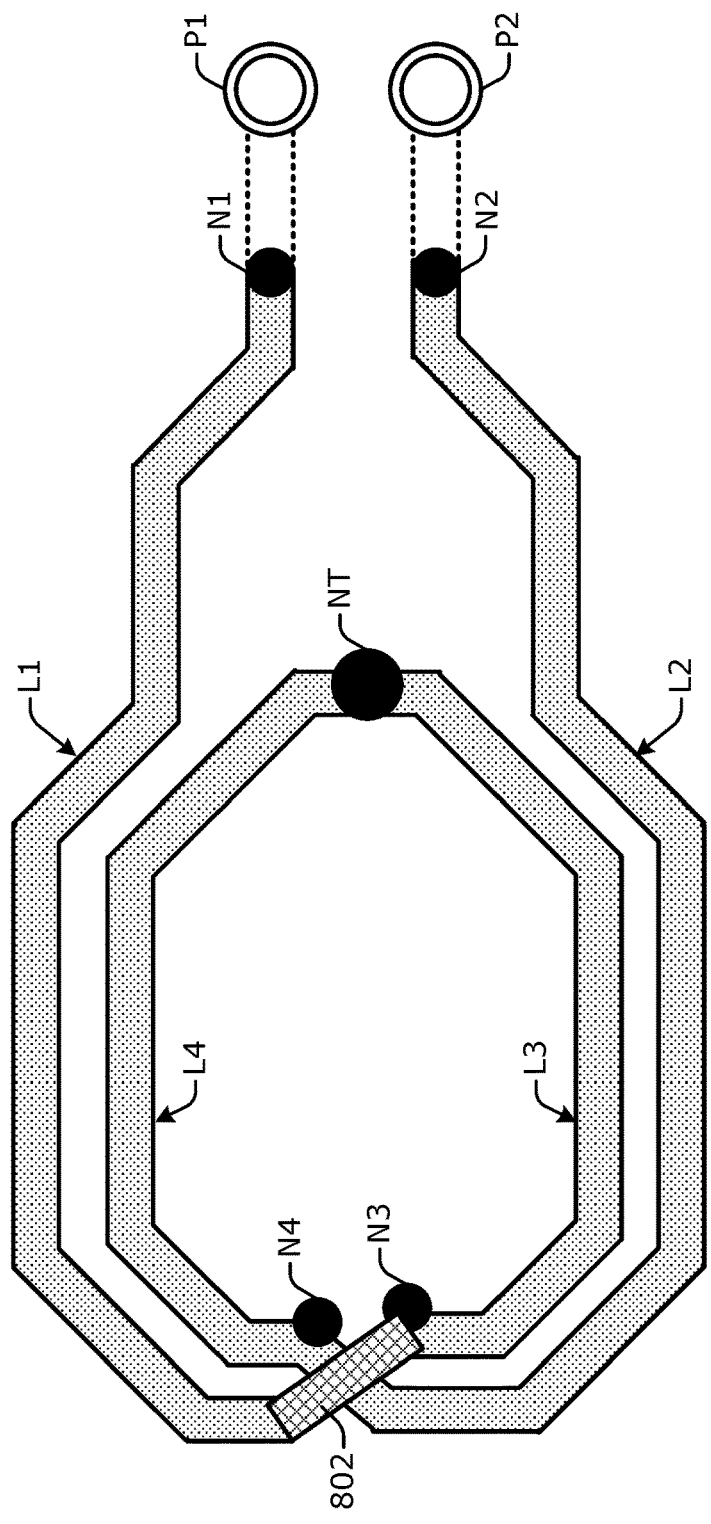
Figures 2, 8:
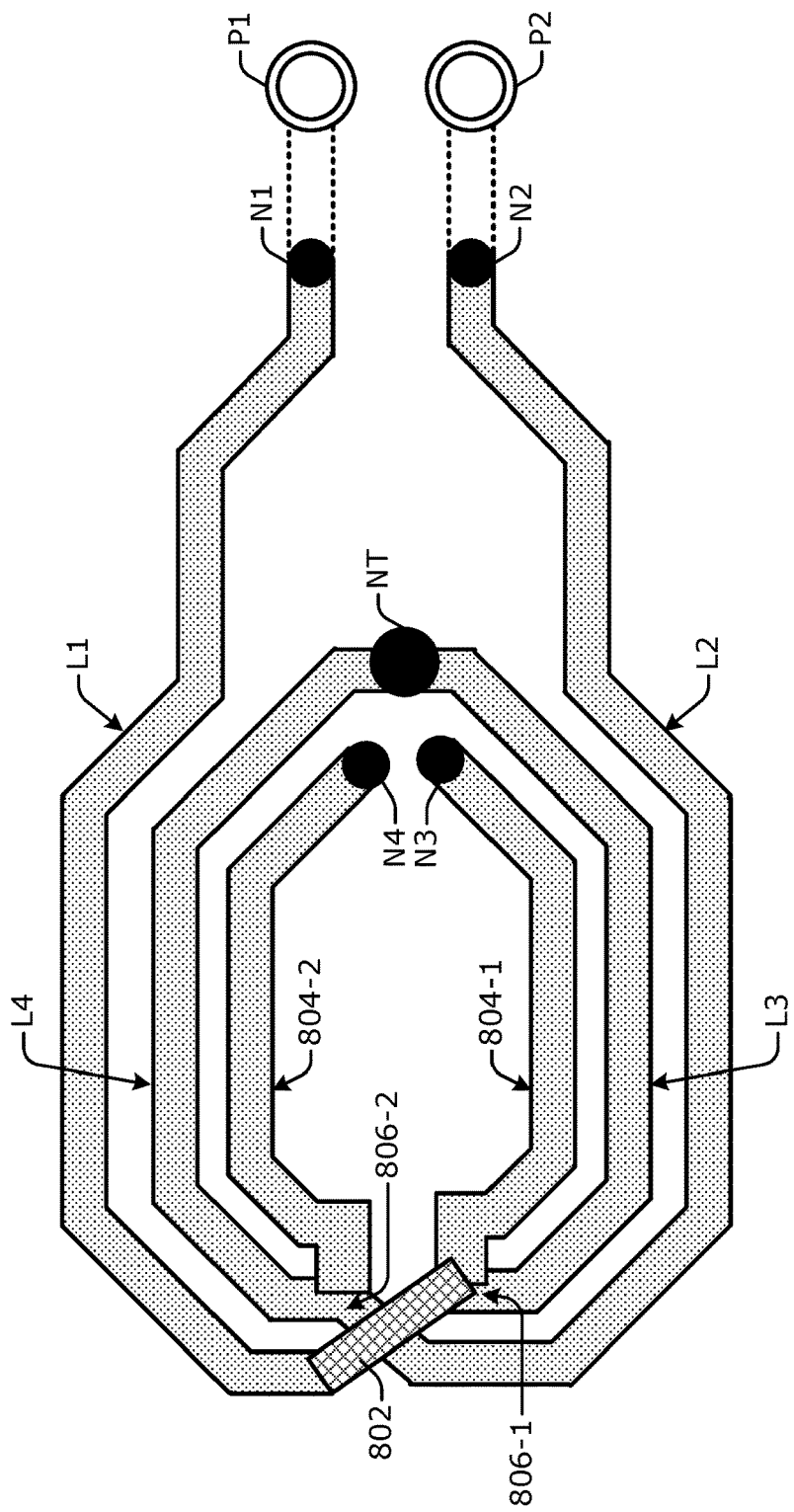

FIG. 8-1 illustrates an example physical implementation 800-1 for the multiple inductors of a tunable passive phase shifter. Each of the inductors may be realized with a coil, a stripline, a microstrip, some combination thereof, and so forth. The physical implementation 800-1 can be realized, for example, with metallic traces on two metal layers. A majority of the material for the inductors is disposed in a single metal layer as represented by the dotted fill pattern. However, one connector 802 is disposed in another metal layer as represented by the cross-hatched fill pattern. The physical implementation 800-1 is relatively compact as there is some measure of nesting between and among the inductors. However, any one or more of the inductors L1, L2, L3, and L4 can be realized in a different manner (e.g., in a different shape, having a different orientation with regard to another inductor, in a different layer, or with a different length or width). Further, the inductors are not necessarily drawn to scale.

For the physical implementation 800-1, FIG. 8-1 includes indications of five nodes: the first node N1 (which can correspond to the first port P1 of the phase shifter), the second node N2 (which can correspond to the second port P2 of the phase shifter), the third node N3, the fourth node N4, and the tap node NT. The first inductor L1 is coupled between the first node N1 and the third node N3. The third inductor L3 is coupled between the third node N3 and the tap node NT. The fourth inductor L4 is coupled between the tap node NT and the fourth node N4. The second inductor L2 is coupled between the fourth node N4 and the second node N2. Although not shown in FIG. 8-1, the bypass paths BP1 and BP2 and the capacitors C1 and C2 can be coupled to the indicated nodes as shown in preceding figures, such as FIGS. 4-2, 5, 6, and 7.

FIG. 8-2 illustrates another example physical implementation 800-2 for the multiple inductors of a tunable passive phase shifter in conjunction with multiple tuning extensions 804-1 and 804-2. In some circumstances, the inductors L1, L2, L3, and L4, in conjunction with the other circuit components, may not function as intended using the physical implementation 800-1 of FIG. 8-1 without additional tuning. A first tuning extension 804-1 and a second tuning extension 804-2 can provide such tuning. The first tuning extension 804-1 is disposed between an end 806-1 (which is visually obscured by the connector 802) of the third inductor L3 and the third node N3. The first tuning extension 804-1 therefore provides a measure of spatial separation for the third node N3 and additional trace length to the third node N3. Similarly, the second tuning extension 804-2 is disposed between an end 806-2 of the fourth inductor L4 and the fourth node N4. The second tuning extension 804-2 therefore provides a measure of spatial separation for the fourth node N4 and additional trace length to the fourth node N4. From an alternative perspective, the first and second tuning extensions 804-1 and 804-2 change a length, and therefore an inductance, of the third and fourth inductor L3 and L4, respectively, or an effective inductance of a combination of one or more of the inductors L1, L2, L3, or L4, depending on bypass switch states. Experimentation can be used to determine a desirable length and shape of the tuning extensions 804-1 and 804-2 relative to that of the inductors L1-L4 for a given set of frequency bands.

Figure 9:
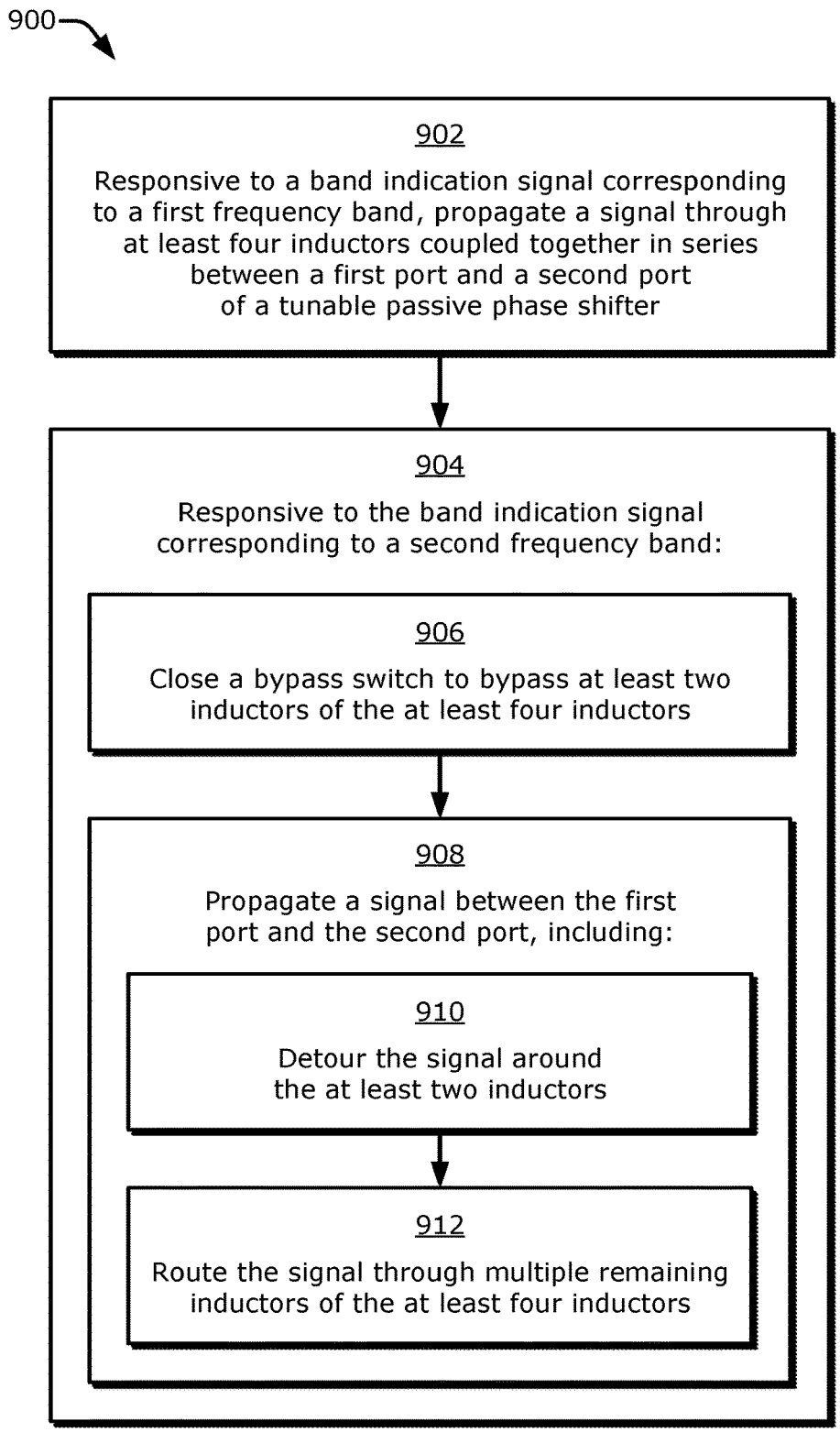
FIG. 9 is a flow diagram illustrating an example process for operating a tunable passive phase shifter.

FIG. 9 is a flow diagram illustrating an example process 900 for operating a tunable passive phase shifter. The process 900 is described in the form of a set of blocks 902-912 that specify operations that can be performed.

However, operations are not necessarily limited to the order shown in FIG. 9 or described herein, for the operations may be implemented in alternative orders or in fully or partially overlapping manners. Operations represented by the illustrated blocks of the process 900 may be performed by a phase shifter 130 or a portion thereof in conjunction with a controller, such as the RFFE controller 312. More specifically, the operations of the process 900 may be performed by an inductive path 402, one or more bypass paths, or one or more switches.

At block 902, responsive to a band indication signal corresponding to a first frequency band, a signal is propagated through at least four inductors coupled together in series between a first port and a second port of the tunable passive phase shifter. For example, responsive to a band indication signal 420 corresponding to a first frequency band 418-1, a signal 308 can be propagated through at least four inductors L1, L2, L3, and L4 coupled together in series between a first port P1 and a second port P2 of a tunable passive phase shifter 130. To cause this propagation, at least a second bypass switch BS2 of a second bypass path BP2 may be placed in an open state. If present, a first bypass switch BS1 of a first bypass path BP1 may also be placed in an open state.

At block 904, responsive to the band indication signal corresponding to a second frequency band, the operations of blocks 906 and 908 are performed. For example, responsive to the band indication signal 420 corresponding to a second frequency band 418-2, the second bypass path BP2 can be activated. At block 906, a bypass switch is closed to bypass at least two inductors of the at least four inductors. For example, the RFFE controller 312 can close the second bypass switch BS2 of the second bypass path BP2 to bypass at least two inductors (e.g., the third inductor L3 and the fourth inductor L4) of the at least four inductors L1, L2, L3, and L4.

At block 908, a signal is propagated between the first port and the second port by performing the operations of blocks 910 and 912. For example, a signal 308 can be propagated between the first port P1 and the second port P2 using the second bypass path BP2. At block 910, the signal is detoured around the at least two inductors. For example, the second bypass path BP2 can substantially detour the signal 308 around the at least two inductors (e.g., the third inductor L3 and the fourth inductor L4). At block 912, the signal is routed through multiple remaining inductors of the at least four inductors. For example, a combination of the inductive path 402 and the second bypass path BP2 can route the signal 308 through multiple remaining inductors (e.g., the first inductor L1 and the second inductor L2) of the at least four inductors L1, L2, L3, and L4. For instance, the phase shifter 130 may route the signal 308 through those inductors that are not coupled in parallel with the second bypass path BP2 while the second bypass path BP2 is activated.

Unless context dictates otherwise, use herein of the word "or" may be considered use of an "inclusive or," or a term that permits inclusion or application of one or more items that are linked by the word "or" (e.g., a phrase "A or B" may be interpreted as permitting just "A," as permitting just "B," or as permitting both "A" and "B"). Further, items represented in the accompanying figures and terms discussed herein may be indicative of one or more items or terms, and thus reference may be made interchangeably to single or plural forms of the items and terms in this written description. Finally, although subject matter has been described in language specific to structural features or methodological operations, it is to be understood that the subject matter defined in the appended claims is not necessarily limited to the specific features or operations described above, including not necessarily being limited to the organizations in which features are arranged or the orders in which operations are performed.

What is claimed is:

1. An apparatus for phase shifting, the apparatus comprising:
a phase shifter including:
a first port;
a second port;
an inductive path coupled between the first port and the second port;
the inductive path including multiple inductors and multiple nodes, the multiple inductors coupled together in series between the first port and the second port, the multiple nodes interleaved with the multiple inductors along the inductive path;
a first bypass path coupled to a first pair of nodes of the multiple nodes; and
a second bypass path coupled to a second pair of nodes of the multiple nodes.

2. The apparatus of claim 1, wherein:
the first bypass path includes a first bypass switch; and
the second bypass path includes a second bypass switch.

3. The apparatus of claim 2, wherein:
the first bypass switch is configured to be in an open state or a closed state;
the second bypass switch is configured to be in the open state or the closed state;
the first bypass path is configured to enable a signal to bypass a first quantity of the multiple inductors responsive to the first bypass switch being in the closed state; and
the second bypass path is configured to enable the signal to bypass a second quantity of the multiple inductors responsive to the second bypass switch being in the closed state, the first quantity being different from the second quantity.

4. The apparatus of claim 3, further comprising:
a controller configured to:
responsive to the signal corresponding to a first frequency band, cause the first bypass switch to be in the open state and the second bypass switch to be in the open state; and
responsive to the signal corresponding to a second frequency band, cause the first bypass switch to be in the open state and the second bypass switch to be in the closed state.

5. The apparatus of claim 4, wherein the controller is configured to cause the first bypass switch to be in the closed state to selectively disengage the phase shifter.

6. The apparatus of claim 1, wherein nodes of the first pair of nodes are exclusive of other nodes of the second pair of nodes.

7. The apparatus of claim 1, wherein:
the multiple nodes include a tap node; and
the phase shifter includes at least one capacitor coupled to the tap node.

8. The apparatus of claim 7, wherein the tap node comprises a central tap node along the inductive path in which an equal quantity of inductors of the multiple inductors is disposed on each side of the central tap node.

9. The apparatus of claim 7, wherein:
the at least one capacitor comprises a first capacitor and a second capacitor;

the first capacitor is coupled between the tap node and a ground; and the second capacitor is coupled between the tap node and the ground.

10. The apparatus of claim 1, wherein:

the phase shifter is configured to operate in accordance with a first frequency band and a second frequency band;

the multiple inductors include a first pair of inductors and a second pair of inductors;

a first inductance of each inductor of the first pair of inductors has a first value that is based on the second frequency band and a targeted phase shift; and a second inductance of each inductor of the second pair of inductors has a second value that is based on the first frequency band, the second frequency band, and the targeted phase shift.

11. The apparatus of claim 1, further comprising:

a multi-bit multi-band phase shifter including multiple phase-shift units, each phase-shift unit corresponding to a respective phase-shift amount of multiple phase-shift amounts, wherein a phase-shift unit of the multiple phase-shift units includes the phase shifter.

12. The apparatus of claim 11, wherein:

the multi-bit multi-band phase shifter comprises a differential multi-bit multi-band phase shifter including a plus differential signal path and a minus differential signal path; and the phase shifter is disposed along the plus differential signal path or the minus differential signal path.

13. The apparatus of claim 1, further comprising:

a radio-frequency front-end, the radio-frequency front-end including the phase shifter;

a transceiver coupled to the phase shifter of the radio-frequency front-end; and a communication processor coupled to the radio-frequency front-end and the transceiver, the communication processor configured to control operation of the phase shifter of the radio-frequency front-end and the transceiver to cause the apparatus to transmit and receive wireless signals using at least one signal beam.

14. A system for shifting phases of signals, the system comprising:

a multi-band phase shifter including:
 a first port;
 a second port;
 an inductive path coupled between the first port and the second port; the inductive path including multiple nodes comprising a first pair of nodes and a second pair of nodes; the inductive path including multiple inductors coupled together in series and interleaved with the multiple nodes; each node of the second pair of nodes positioned between two inductors of the multiple inductors; and
 bypass means for switching a frequency band to which the multi-band phase shifter is tuned, the bypass means coupled to the second pair of nodes and configured to selectively enable a signal detour around a portion of the multiple inductors.

15. The system of claim 14, further comprising:

bypass means for disengaging the multi-band phase shifter, the bypass means for disengaging coupled to the first port and the second port.

16. The system of claim 15, further comprising:

control means for controlling:
 the bypass means for switching frequency bands responsive to at least one band indication signal; and
 the bypass means for disengaging the multi-band phase shifter responsive to at least one bit control signal.

17. The system of claim 14, further comprising:

capacitor means for combining a capacitance with an inductance of at least a portion of the multiple inductors to match an impedance of a component coupled to the multi-band phase shifter.

18. The system of claim 14, wherein:

the first pair of nodes correspond to the first port and the second port;

the multiple inductors include a first inductor, a second inductor, a third inductor, and a fourth inductor;

the third inductor and the fourth inductor are coupled together in series between the second pair of nodes via a tap node;

the first inductor is coupled between one node of the second pair of nodes and the first port; and the second inductor is coupled between another node of the second pair of nodes and the second port.

19. A method for operating a tunable passive phase shifter, the method comprising:

responsive to a band indication signal corresponding to a first frequency band, propagating a signal through at least four inductors coupled together in series between a first port and a second port of the tunable passive phase shifter; and responsive to the band indication signal corresponding to a second frequency band,
 closing a bypass switch to bypass at least two inductors of the at least four inductors; and
 propagating a signal between the first port and the second port by:
  detouring the signal around the at least two inductors; and
  routing the signal through multiple remaining inductors of the at least four inductors.

20. The method of claim 19, wherein:

the bypass switch comprises a second bypass switch; and the method further comprises:
 responsive to a bit control signal corresponding to a disengagement mode for the tunable passive phase shifter, closing a first bypass switch to bypass the at least four inductors; and
 responsive to the bit control signal corresponding to an engagement mode for the tunable passive phase shifter, opening the first bypass switch to enable the band indication signal to control propagation of the signal through at least a portion of the at least four inductors.

21. The method of claim 19, wherein the propagating of the signal through the at least four inductors comprises:

propagating a received signal from the first port to the second port at one time; and propagating a transmission signal from the second port to the first port at another time.

22. The method of claim 19, further comprising:

closing at least one capacitor switch to couple at least one capacitor between a ground and a node, which couples the at least two inductors to each other, based on the band indication signal.

23. The method of claim 19, further comprising:

coupling the signal to or from an antenna element for transmission or reception, respectively; and generating a signal beam for the transmission or the reception using the coupled signal.

24. An apparatus for phase shifting, the apparatus comprising:
a phase shifter including:
multiple ports including a first port and a second port;
multiple nodes including a first node, a second node, a third node, a fourth node, and a tap node; the first node coupled to the first port, and the second node coupled to the second port;
multiple inductors including a first inductor, a second inductor, a third inductor, and a fourth inductor,
the first inductor coupled between the first node and the third node;
the third inductor coupled between the third node and the tap node;
the fourth inductor coupled between the tap node and the fourth node; and
the second inductor coupled between the fourth node and the second node; and
a bypass path coupled to the third node and the fourth node, the bypass path including a bypass switch.

25. The apparatus of claim 24, wherein:
the bypass path comprises a second bypass path, and the bypass switch comprises a second bypass switch; and
the phase shifter includes a first bypass path coupled to the first node and the second node, the first bypass path including a first bypass switch.

26. The apparatus of claim 25, further comprising:
a multi-bit multi-band phase shifter including multiple phase-shift units, each respective phase-shift unit of the multiple phase-shift units configured to shift a signal by a respective phase-shift amount of multiple phase-shift amounts,
wherein a phase-shift unit of the multiple phase-shift units includes the phase shifter.

27. The apparatus of claim 26, further comprising:
a radio-frequency front-end (RFFE) controller configured to:
cause the first bypass switch to be in an open state or a closed state based on an engagement mode for the phase-shift unit that includes the phase shifter; and
cause the second bypass switch to be in the open state or the closed state based on a frequency band corresponding to a signal to be phase shifted.

28. The apparatus of claim 24, wherein the phase shifter includes:
multiple capacitors including a first capacitor and a second capacitor, the first capacitor and the second capacitor coupled to the tap node; and
multiple capacitor switches including a first capacitor switch and a second capacitor switch, the first capacitor switch coupled between the first capacitor and a ground, and the second capacitor switch coupled between the second capacitor and the ground.

29. The apparatus of claim 24, further comprising:
an antenna element;
multiple amplifiers including a low-noise amplifier and a power amplifier, the multiple amplifiers coupled between the antenna element and the first port of the phase shifter; and
at least one splitter/combiner coupled to the second port of the phase shifter.

30. The apparatus of claim 24, wherein the bypass path includes another bypass switch, the bypass switch coupled between the third node and the tap node, and the other bypass switch coupled between the tap node and the fourth node.

* * * * *